United States Patent
Yoo

(10) Patent No.: US 9,508,820 B2
(45) Date of Patent: Nov. 29, 2016

(54) SEMICONDUCTOR DEVICES AND METHODS OF MANUFACTURING THE SAME

(71) Applicant: Samsung Electronics Co., Ltd., Suwon-si (KR)

(72) Inventor: Jae-Hyun Yoo, Hwaseong-si (KR)

(73) Assignee: Samsung Electronics Company, LTD., Suwon-Si (KR)

( * ) Notice: Subject to any disclaimer, the term of this patent is extended or adjusted under 35 U.S.C. 154(b) by 33 days.

(21) Appl. No.: 14/503,811

(22) Filed: Oct. 1, 2014

(65) Prior Publication Data
US 2015/0115375 A1  Apr. 30, 2015

(30) Foreign Application Priority Data

Oct. 24, 2013 (KR) .................. 10-2013-0127005

(51) Int. Cl.
| | |
|---|---|
| H01L 29/423 | (2006.01) |
| H01L 29/51 | (2006.01) |
| H01L 29/66 | (2006.01) |
| H01L 29/165 | (2006.01) |

(52) U.S. Cl.
CPC ......... *H01L 29/517* (2013.01); *H01L 29/4238* (2013.01); *H01L 29/42376* (2013.01); *H01L 29/66545* (2013.01); *H01L 29/66553* (2013.01); *H01L 29/66628* (2013.01); *H01L 29/66636* (2013.01); *H01L 29/165* (2013.01); *H01L 29/513* (2013.01); *H01L 29/665* (2013.01)

(58) Field of Classification Search
CPC .............. H01L 21/823437; H01L 21/823456; H01L 29/42312; H01L 29/42316; H01L 29/4232; H01L 29/4234
See application file for complete search history.

(56) References Cited

U.S. PATENT DOCUMENTS

| | | | | |
|---|---|---|---|---|
| 4,577,392 A | * | 3/1986 | Peterson | H01L 29/41783 148/DIG. 19 |
| 5,298,443 A | * | 3/1994 | Jang | H01L 21/28518 148/DIG. 117 |
| 5,369,303 A | * | 11/1994 | Wei | H01L 21/76897 257/751 |
| 5,668,021 A | * | 9/1997 | Subramanian | H01L 29/66553 257/E21.434 |
| 5,686,331 A | * | 11/1997 | Song | H01L 21/823443 257/E21.438 |
| 5,750,430 A | * | 5/1998 | Son | H01L 29/1045 257/E21.434 |
| 5,786,256 A | * | 7/1998 | Gardner | H01L 29/66583 257/E21.206 |
| 5,808,320 A | * | 9/1998 | Dennison | H01L 23/485 257/413 |
| 5,879,998 A | * | 3/1999 | Krivokapic | H01L 21/28114 257/E21.205 |
| 5,946,578 A | * | 8/1999 | Fujii | H01L 29/41775 257/E29.122 |
| 6,015,746 A | * | 1/2000 | Yeh | H01L 29/4983 257/E21.434 |

(Continued)

FOREIGN PATENT DOCUMENTS

| | | |
|---|---|---|
| JP | 2001-015749 | 1/2001 |
| JP | 2003-023147 | 1/2003 |

(Continued)

*Primary Examiner* — Earl Taylor
(74) *Attorney, Agent, or Firm* — Myers Bigel, P.A.

(57) ABSTRACT

A semiconductor device includes a gate insulation layer pattern, a lower gate electrode, an upper gate electrode, and a first inner spacer. The gate insulation layer pattern is formed on a substrate. The lower gate electrode is formed on the gate insulation layer pattern. The upper gate electrode is formed on the lower gate electrode and has a width that gradually increases from a bottom portion toward a top portion thereof. The width of the bottom portion of the upper gate electrode is smaller than a width of a top surface of the lower gate electrode. The first inner spacer surrounds a sidewall of the upper gate electrode.

12 Claims, 23 Drawing Sheets

(56) References Cited

U.S. PATENT DOCUMENTS

| | | | | |
|---|---|---|---|---|
| 6,096,641 A * | 8/2000 | Kunikiyo | ........... | H01L 21/28105 257/E21.196 |
| 6,096,642 A * | 8/2000 | Wu | ........... | H01L 29/665 257/E21.438 |
| 6,136,675 A * | 10/2000 | Lee | ........... | H01L 21/28052 257/E21.199 |
| 6,159,806 A * | 12/2000 | Chern | ........... | H01L 21/823468 257/E21.626 |
| 6,261,948 B1 * | 7/2001 | Dennison | ........... | H01L 23/485 257/E23.019 |
| 6,271,126 B2 * | 8/2001 | Dennison | ........... | 257/E23.019 |
| 6,358,800 B1 * | 3/2002 | Tseng | ........... | H01L 21/3086 257/E21.235 |
| 6,387,789 B1 * | 5/2002 | Kim | ........... | H01L 21/28052 257/E21.199 |
| 6,406,945 B1 * | 6/2002 | Lee | ........... | H01L 21/28167 257/368 |
| 6,461,904 B1 * | 10/2002 | Jin | ........... | H01L 21/28114 257/E21.205 |
| 6,504,210 B1 * | 1/2003 | Divakaruni | ........... | H01L 21/28044 257/344 |
| 6,562,687 B1 * | 5/2003 | Deleonibus | ........... | H01L 21/28035 257/E21.197 |
| 6,661,066 B2 * | 12/2003 | Kuroi | ........... | H01L 21/26586 257/344 |
| 6,821,855 B2 * | 11/2004 | Juengling | ........... | H01L 21/26586 257/E21.2 |
| 7,018,914 B2 * | 3/2006 | Cho | ........... | H01L 21/26506 257/335 |
| 7,045,867 B2 * | 5/2006 | Dang | ........... | H01L 29/78621 257/288 |
| 7,095,086 B2 * | 8/2006 | Koh | ........... | H01L 29/42368 257/408 |
| 7,129,143 B2 * | 10/2006 | Park | ........... | H01L 21/28114 257/E21.205 |
| 7,208,399 B2 * | 4/2007 | Chu | ........... | H01L 21/28114 257/E21.011 |
| 7,282,423 B2 * | 10/2007 | Furukawa | ........... | H01L 21/26586 257/E21.201 |
| 7,361,565 B2 * | 4/2008 | Shin | ........... | H01L 21/28114 257/E21.205 |
| 7,569,444 B2 * | 8/2009 | Ho | ........... | H01L 21/28114 257/E21.433 |
| 7,705,409 B2 * | 4/2010 | Kwon | ........... | H01L 29/0653 257/402 |
| 7,939,895 B2 * | 5/2011 | Fukasaku | ........... | H01L 21/28097 257/204 |
| 8,048,792 B2 * | 11/2011 | Beyer | ........... | H01L 29/6653 257/410 |
| 8,309,411 B2 * | 11/2012 | Na | ........... | 257/E21.434 |
| 8,569,140 B2 * | 10/2013 | Kim | ........... | H01L 21/28114 257/E21.444 |
| 8,716,079 B2 * | 5/2014 | Heinrich | ........... | H01L 21/823842 257/E21.444 |
| 8,754,464 B2 * | 6/2014 | Sim | ........... | H01L 21/28273 257/314 |
| 8,772,168 B2 * | 7/2014 | Xie | ........... | H01L 21/28088 216/13 |
| 8,772,872 B2 * | 7/2014 | Tak | ........... | H01L 21/28114 257/347 |
| 8,823,113 B2 * | 9/2014 | Chae | ........... | H01L 29/4238 257/368 |
| 9,041,114 B2 * | 5/2015 | Ide | ........... | H01L 27/11524 257/364 |
| 9,087,886 B2 * | 7/2015 | Kim | ........... | H01L 21/02697 |
| 9,123,774 B2 * | 9/2015 | Suk | ........... | H01L 29/66545 |
| 9,275,937 B2 * | 3/2016 | Lee | ........... | H01L 27/10855 |
| 2002/0072184 A1 * | 6/2002 | Higuchi | ........... | H01L 21/76897 438/303 |
| 2002/0132431 A1 * | 9/2002 | Fung | ........... | H01L 29/42376 438/300 |
| 2004/0157383 A1 * | 8/2004 | Park | ........... | H01L 29/66545 438/197 |
| 2004/0188726 A1 * | 9/2004 | Iriyama | ........... | H01L 21/76895 257/288 |
| 2005/0186792 A1 * | 8/2005 | Takahashi | ........... | H01L 21/31116 438/673 |
| 2008/0265322 A1 * | 10/2008 | Lin | ........... | H01L 21/28079 257/347 |
| 2009/0008699 A1 * | 1/2009 | Park | ........... | H01L 21/28273 257/321 |
| 2009/0085075 A1 * | 4/2009 | Kim | ........... | H01L 21/28044 257/288 |
| 2009/0159990 A1 * | 6/2009 | Park | ........... | H01L 29/42368 257/408 |
| 2009/0200595 A1 * | 8/2009 | Nagai | ........... | H01L 21/28273 257/316 |
| 2009/0212332 A1 * | 8/2009 | Wang | ........... | H01L 29/4983 257/288 |
| 2010/0044783 A1 * | 2/2010 | Chuang | ........... | H01L 21/28114 257/328 |
| 2011/0062501 A1 * | 3/2011 | Soss | ........... | H01L 21/28114 257/288 |
| 2011/0076844 A1 * | 3/2011 | Heinrich | ........... | H01L 21/823425 438/595 |
| 2011/0237062 A1 * | 9/2011 | Na | ........... | H01L 21/823842 438/592 |
| 2012/0001271 A1 * | 1/2012 | Chae | ........... | H01L 29/4238 257/401 |
| 2012/0088359 A1 * | 4/2012 | Kim | ........... | H01L 21/28114 438/589 |
| 2012/0248509 A1 * | 10/2012 | Guo | ........... | H01L 29/4966 257/288 |
| 2012/0273903 A1 * | 11/2012 | Hirase | ........... | H01L 29/42368 257/410 |
| 2012/0319205 A1 * | 12/2012 | Hempel | ........... | H01L 21/823842 257/368 |
| 2012/0322218 A1 * | 12/2012 | Lai | ........... | H01L 21/823842 438/303 |
| 2013/0037876 A1 * | 2/2013 | Omoto | ........... | H01L 27/11543 257/315 |
| 2013/0049142 A1 * | 2/2013 | Liu | ........... | H01L 29/4983 257/412 |
| 2013/0187203 A1 * | 7/2013 | Xie | ........... | H01L 21/28088 257/288 |
| 2013/0270569 A1 * | 10/2013 | Chang | ........... | H01L 21/28247 257/66 |
| 2014/0203348 A1 * | 7/2014 | Suk | ........... | H01L 29/66545 257/327 |
| 2014/0299939 A1 * | 10/2014 | Kim | ........... | H01L 21/02697 257/369 |
| 2014/0339613 A1 * | 11/2014 | Ide | ........... | H01L 27/11524 257/288 |
| 2015/0115375 A1 * | 4/2015 | Yoo | ........... | H01L 29/517 257/411 |
| 2015/0311208 A1 * | 10/2015 | Kim | ........... | H01L 21/02697 257/369 |

FOREIGN PATENT DOCUMENTS

| | | | | |
|---|---|---|---|---|
| JP | 2003023147 A | * | 1/2003 | |
| KR | 20000007795 A | | 2/2000 | |
| KR | 20140121634 A | * | 10/2014 | ....... H01L 21/02697 |

* cited by examiner

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗ ⟶ 2ND DIRECTION

1ST DIRECTION
⊗⎯⎯ 2ND DIRECTION

1ST DIRECTION
⊗⎯⎯ 2ND DIRECTION

1ST DIRECTION
⊗ → 2ND DIRECTION

1ST DIRECTION
⊗ → 2ND DIRECTION

1ST DIRECTION
⊗ ⟶ 2ND DIRECTION

1ST DIRECTION
⊗ ⟶ 2ND DIRECTION

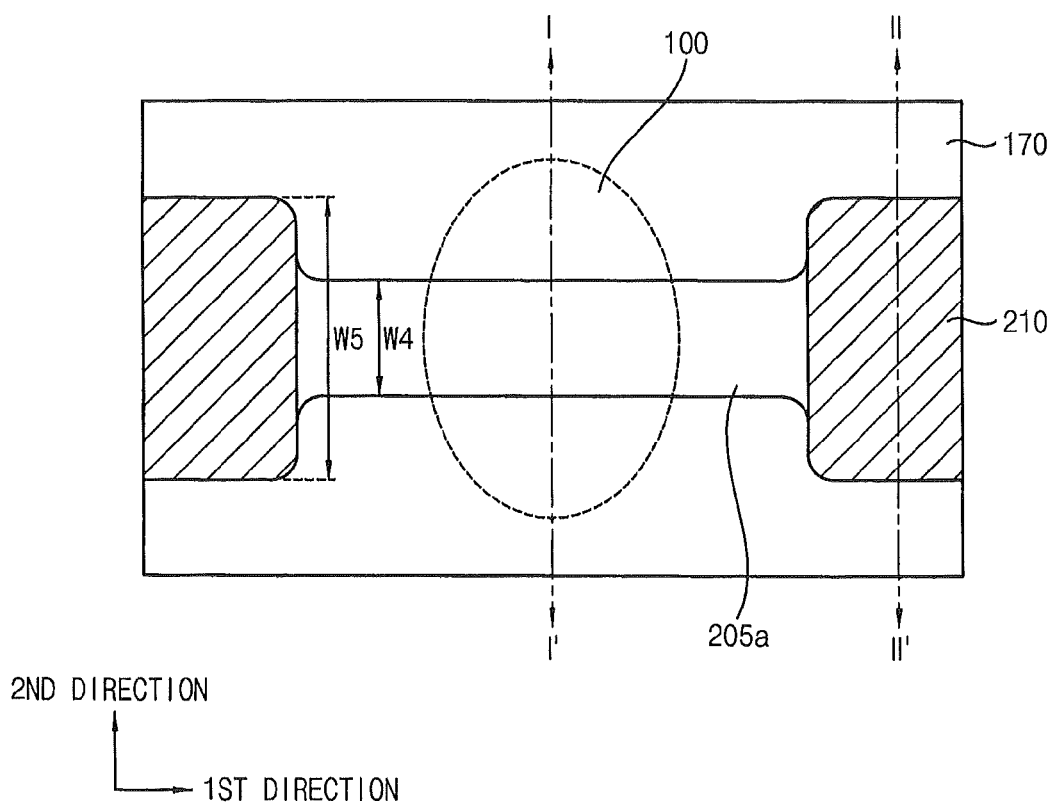

SEMICONDUCTOR DEVICES AND METHODS OF MANUFACTURING THE SAME

CROSS-REFERENCE TO RELATED APPLICATION

This application claims priority under 35 USC §119 to Korean Patent Application No. 10-2013-0127005, filed on Oct. 24, 2013 in the Korean Intellectual Property Office (KIPO), the contents of which are hereby incorporated herein by reference in their entirety.

BACKGROUND

The present disclosure relates to semiconductor devices. As semiconductor devices become highly integrated, a leakage current may occur through a gate insulation layer under a gate electrode. To inhibit the leakage current, a high-k dielectric layer may be formed to surround a bottom and a sidewall of the gate electrode. A parasitic capacitance, however, may occur between the gate electrode and a contact plug adjacent the gate electrode.

SUMMARY

Example embodiments provide a semiconductor device including a gate structure having good characteristics.

Example embodiments provide a method of manufacturing a semiconductor device including a gate structure having good characteristics.

According to example embodiments, there is provided a semiconductor device. The semiconductor device includes a gate insulation layer pattern, a lower gate electrode, an upper gate electrode, and a first inner spacer. The gate insulation layer pattern is formed on a substrate. The lower gate electrode is formed on the gate insulation layer pattern. The upper gate electrode is formed on the lower gate electrode and has a width that gradually increases from a bottom portion toward a top portion thereof. The width of the bottom portion of the upper gate electrode is smaller than a width of a top surface of the lower gate electrode. The first inner spacer surrounds a sidewall of the upper gate electrode.

In example embodiments, the gate structure may further include a high-k dielectric layer pattern on the gate insulation layer pattern. The high-k dielectric layer pattern may surround a bottom and a sidewall of the lower gate electrode.

In example embodiments, the gate structure may further include a second inner spacer on the gate insulation layer pattern. The second inner spacer may surround an outer sidewall of the high-k dielectric layer pattern.

In example embodiments, the width of the top portion of the upper gate electrode may be substantially the same as a width of the bottom portion of the high-k dielectric layer pattern.

In example embodiments, the width of the lower gate electrode may be substantially the same as the width of the top portion of the upper gate electrode.

In example embodiments, the first inner spacer may include a low-k dielectric material.

In example embodiments, the semiconductor device may further include a contact plug including a metal on the substrate adjacent to the gate structure.

In example embodiments, the lower gate electrode may be a single layer having a width that does not substantially vary vertically.

According to example embodiments, there is provided a method of manufacturing a semiconductor device. In the method, a gate insulation layer pattern is formed on a substrate. A first inner spacer partially covering a top surface of the lower gate electrode is formed. An upper gate electrode is formed on the lower gate electrode to fill a space defined by a top surface of the lower gate electrode and the first inner spacer. The upper gate electrode has a width that gradually increases from a bottom portion toward a top portion thereof, and the width of the bottom portion of the upper gate electrode is smaller than a width of a top surface of the lower gate electrode.

In example embodiments, when the lower gate electrode is formed, a dummy gate electrode is formed on the gate insulation layer pattern to define a dummy gate structure including the gate insulation layer pattern and the dummy gate electrode. An insulating interlayer is formed to cover a sidewall of the dummy gate structure. The dummy gate electrode is removed to form an opening exposing the gate insulation layer pattern. A high-k dielectric layer is formed on the exposed gate insulation layer pattern, a sidewall of the opening and the insulating interlayer. A gate electrode layer is formed on the high-k dielectric layer to fill a remaining portion of the opening. The gate electrode layer and the high-k dielectric layer are planarized until a top surface of the insulating interlayer is exposed to form a preliminary gate electrode and a preliminary high-k dielectric layer pattern filling the opening. The preliminary gate electrode and the preliminary high-k dielectric layer pattern are partially removed to form the lower gate electrode and a high-k dielectric layer pattern surrounding a bottom and a sidewall of the lower gate electrode.

In example embodiments, prior to forming the high-k dielectric layer, a second inner spacer layer may be formed on the exposed gate insulation layer pattern, the sidewall of the opening and the insulating interlayer by an atomic layer deposition (ALD) process. The second inner spacer layer may be anisotropically etched to form a preliminary second inner spacer on the sidewall of the opening. When the lower gate electrode and the high-k dielectric layer pattern are formed, the preliminary second inner spacer may be partially removed to form a second inner spacer surrounding a sidewall of the high-k dielectric layer pattern.

In example embodiments, when the lower gate electrode is formed, a preliminary gate electrode may be formed on the gate insulation layer pattern. An upper portion of the preliminary gate electrode may be removed to form the lower gate electrode.

In example embodiments, when the lower gate electrode is formed, an insulating interlayer containing the gate insulation layer pattern and the lower gate electrode therein and having a recess exposing a top surface of the lower gate electrode may be formed on the substrate. When the first inner spacer and the upper gate electrode are formed, a first inner spacer layer may be formed on the exposed top surface of the lower gate electrode, a sidewall of the recess and the insulating interlayer. The first inner spacer layer is anisotropically etched to form the first inner spacer covering the exposed top surface of the lower gate electrode on the sidewall of the recess. The upper gate electrode is formed on the exposed top surface of the lower gate electrode to fill a remaining portion of the recess.

According to example embodiments, there is provided a semiconductor device. The semiconductor device includes a gate insulation layer pattern, a lower gate electrode, an inner spacer layer, an upper gate electrode, and an inner spacer. The gate insulation layer pattern is formed on a substrate and an isolation layer. The substrate includes an active region and a field region by the isolation layer. The lower gate electrode is formed on the gate insulation layer pattern, and includes a first portion at least on the active region of the substrate, and a second portion on the field region of the substrate. The second portion is connected to the first portion and has a width greater than a width of the first portion. The inner spacer layer covers a top surface of the first portion of the lower gate electrode. The upper gate electrode is formed on the second portion of the lower gate electrode, and has a width that gradually increases from a bottom portion toward a top portion thereof. The width of the bottom portion of the upper gate electrode is smaller than a width of a top surface of the second portion of the lower gate electrode. The inner spacer surrounds a sidewall of the upper gate electrode and contacts the inner spacer layer.

According to example embodiments, the gate structure may include the high-k dielectric layer pattern so as to have a decreased leakage current, and have the first inner spacer including the low-k dielectric material so as to decrease a parasitic capacitance between the gate structure and the contact plug. Additionally, the gate structure may include the lower gate electrode so as to keep the desired electrical characteristics with no influence of the first inner spacer or the upper gate electrode. Furthermore, the upper gate electrode may have the top portion wider than the bottom portion thereof, and thus may easily contact the contact plug.

BRIEF DESCRIPTION OF THE DRAWINGS

Example embodiments will be more clearly understood from the following detailed description taken in conjunction with the accompanying drawings. FIGS. 1 to 33 represent non-limiting, example embodiments as described herein.

FIG. 1 is a cross-sectional view illustrating a gate structure of a semiconductor device according to example embodiments of present inventive concepts;

FIGS. 2 to 10 are cross-sectional views illustrating a method of manufacturing the gate structure of FIG. 1 according to example embodiments of present inventive concepts;

FIG. 11 is a cross-sectional view illustrating a gate structure of a semiconductor device according to example embodiments of present inventive concepts;

FIGS. 12 to 15 are cross-sectional views illustrating a method of manufacturing the gate structure of FIG. 11 according to example embodiments of present inventive concepts;

FIG. 16 is a cross-sectional view illustrating a gate structure of a semiconductor device according to example embodiments of present inventive concepts;

FIGS. 17 to 19 are cross-sectional views illustrating a method of manufacturing the gate structure of FIG. 16 according to example embodiments of present inventive concepts;

FIG. 20 is a plan view illustrating a semiconductor device according to example embodiments of present inventive concepts.

FIGS. 22, 24 and 26 are plan views of a semiconductor device according to example embodiments of present inventive concepts.

FIG. 28 is a plan view illustrating a semiconductor device in accordance with example embodiments, FIGS. 30 and 32 are plan views of a semiconductor device in accordance with example embodiments of present inventive concepts.

DESCRIPTION OF EMBODIMENTS

Figure 1:
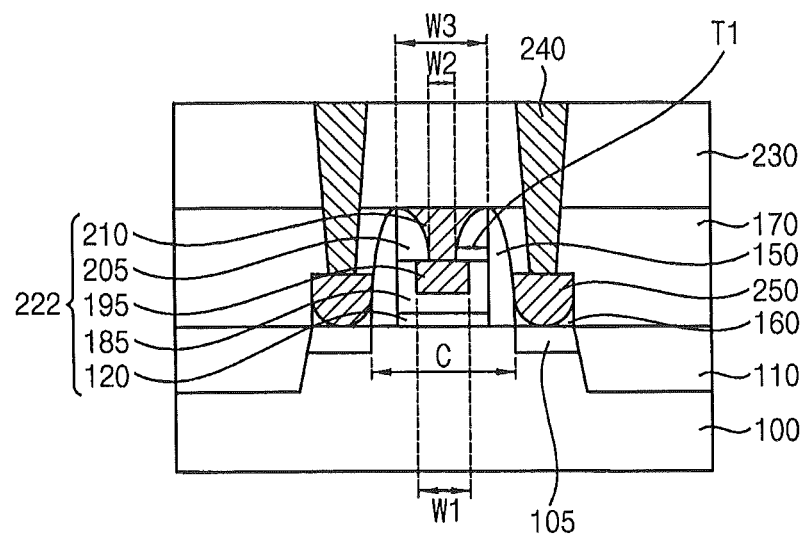

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device in accordance with example embodiments.

Referring to FIG. 1, the semiconductor device may include a gate structure 222 on a substrate 100. Additionally, the semiconductor may include an outer spacer 150, an impurity region 105, an elevated source drain (ESD) layer 160, a metal silicide pattern 250, a first contact plug 240, and first and second insulating interlayers 170 and 230.

The substrate 100 may be a silicon substrate, a germanium substrate, a silicon-germanium substrate, a silicon-on-insulator (SOI) substrate, a germanium-on-insulator (GOI) substrate, etc. The substrate 100 may be divided into a field region on which an isolation layer 110 is formed and an active region on which no isolation layer is formed. The isolation layer 110 may include, e.g., silicon oxide.

In example embodiments, the gate structure 222 may extend in a first direction on the substrate 100 and the isolation layer 110, and a plurality of gate structures 222 may be formed in a second direction substantially perpendicular to the first direction.

The gate structure 222 may include a gate insulation layer pattern 120 on the substrate 100, lower and upper gate electrodes 195 and 210 sequentially stacked on the gate insulation layer pattern 120, and a first inner spacer 205 surrounding a sidewall of the upper gate electrode 210. Additionally, the gate structure 222 may include a high-k dielectric layer pattern 185 that may be formed on the gate insulation layer pattern 120 and surround a bottom and a sidewall of the lower gate electrode 195.

The gate insulation layer pattern 120 may include, e.g., silicon oxide. The high-k dielectric layer pattern 185 may include a metal oxide having a high dielectric constant, e.g., hafnium oxide, tantalum oxide, zirconium oxide, etc.

In example embodiments, the lower gate electrode 195 may have a first width W1 the second direction that may not substantially vary vertically. In an example, the first width W1 is consistent or substantially consistent in the vertical direction. Additionally, the upper gate electrode 210 may have a width along the second direction, which may gradually increase from a bottom portion toward a top portion thereof. The bottom portion of the upper gate electrode 210 may have a second width W2 along the second direction that may be narrower than the first width W1 of the lower gate electrode 195. The top portion of the upper gate electrode 210 may have a third width W3 along the second direction that may be greater than the first width W1 of the lower gate electrode 195, and may be substantially the same as a width of the high-k dielectric layer pattern 185 or that of the gate insulation layer pattern 120.

The lower and upper gate electrodes 195 and 210 may include a material having a low resistance, e.g., a metal such as aluminum, copper, tantalum, etc., or a metal nitride thereof. Alternatively, the lower and upper gate electrodes 195 and 210 may include doped polysilicon. In example embodiments, the lower and upper gate electrodes 195 and 210 may include substantially the same material to be merged to each other. Alternatively, the lower and upper gate electrodes 195 and 210 may include different materials from each other.

The first inner spacer 205 may cover a top surface of the high-k dielectric layer pattern 185 and a portion of the top surface of the lower gate electrode 195. In example embodiments, the first inner spacer 205 may have a first thickness T1 along the second direction that may gradually decrease from a bottom portion toward a top portion thereof in accordance with the increasing width of the upper gate electrode 210. The first inner spacer 205 may include a material having a dielectric constant lower than that of the high-k dielectric layer pattern 185. In example embodiments, the first inner spacer 205 may include silicon dioxide or a low-k dielectric material having a dielectric constant lower than silicon dioxide, e.g., silicon oxide doped with fluorine or carbon, porous silicon oxide, a spin on organic polymer, or an inorganic polymer such as hydrogen silsesquioxane (HSSQ), methyl silsesquioxane (MSSQ), etc.

The outer spacer 150 may be formed on a sidewall of the gate structure 222. The outer spacer 150 may include, e.g., silicon nitride, silicon oxide, etc.

The impurity region 105 may be formed at an upper portion of the substrate 100 adjacent to the gate structure 222. In example embodiments, the impurity region 105 may include, e.g., single crystalline silicon-germanium doped with p-type impurities such as boron, or silicon carbide doped with n-type impurities such as phosphorous. Alternatively, the impurity region 105 may include silicon doped with p-type or n-type impurities.

The ESD layer 160 may be formed on the impurity region 105 and contact the outer spacer 150. The ESD layer 160 may include single crystalline silicon doped with impurities having a conductive type substantially the same as that of the impurities doped in the underlying impurity region 105. The ESD layer 160 may include, e.g., single crystalline silicon doped with p-type impurities such as boron, or single crystalline silicon doped with n-type impurities such as phosphorous.

When the impurity region 105 and the ESD layer 160 include p-type impurities, they may form a p-channel metal oxide semiconductor (PMOS) transistor together with the neighboring gate structure 222, and when the impurity region 105 and the ESD layer 160 include n-type impurities, they may form an n-channel metal oxide semiconductor (NMOS) transistor together with the neighboring gate structure 222. That is, the impurity region 105 and the ESD layer 160 may serve as a source/drain region of a transistor. A channel C of the transistor may be formed at an upper portion of the substrate 100 under the gate structure 222 between the impurity regions 105.

The metal silicide pattern 250 may be formed on the ESD layer 160. In an example embodiment, the metal silicide pattern 250 may be formed through the ESD layer 160 to contact a top surface of the impurity region 105. The metal silicide pattern 250 may include a metal silicide, e.g., cobalt silicide, nickel silicide, platinum silicide, etc.

The first insulating interlayer 170 may surround sidewalls of the gate structure 222 and the outer spacer 150, and cover the impurity region 105, the ESD layer 160 and the metal silicide pattern 250. The second insulating interlayer 230 may be formed on the first insulating interlayer 170 and the gate structure 222. The first and second insulating interlayers 170 and 230 may include, e.g., silicon oxide. The second insulating interlayer 230 may include a material substantially the same as or different from that of the first insulating interlayer 170.

The first contact plug 240 may be formed through the first and second insulating interlayers 170 and 230 to contact the metal silicide pattern 250. The first contact plug 240 may include a metal, a metal nitride, doped polysilicon, etc. Additionally, the first contact plug 240 may have a conductive pattern including a metal and a barrier layer pattern including a metal nitride and surrounding a bottom and a sidewall of the conductive pattern.

The gate structure 222 included in the semiconductor device may include the high-k dielectric layer pattern 185 between the gate insulation layer pattern 120 and the lower gate electrode 195 so as to have a decreased leakage current. Additionally, the gate structure 222 may have the first inner spacer 205 surrounding the sidewall of the upper gate electrode 210 and including a low-k dielectric material so that a parasitic capacitance between the gate structure 222 and the first contact plug 240 may be decreased.

The lower gate electrode 195 that may directly affect an electric field of the channel C at the upper portion of the substrate 100 may have the first width W1 along the second direction, which may not substantially vary vertically regardless of the first inner spacer 205. Since the gate structure 222 may include the lower gate electrode 195, even though the gate structure 222 may include the upper gate electrode 210 having the width vertically varying according to the first thickness T1 of the first inner spacer 205, the semiconductor device may not be affected thereby, and keep the desired electrical characteristics.

Additionally, even though the upper gate electrode 210 may have the second width W2 at the bottom portion thereof, which may be narrow due to the first inner spacer 205, the upper gate electrode 210 may have the third width W3 at the top portion thereof, and thus a contact plug contacting the top portion of the upper gate electrode 210 may be easily formed.

FIGS. 2 to 10 are cross-sectional views illustrating stages of a method of manufacturing a semiconductor device. This method may be used for forming the semiconductor device of FIG. 1, however, may not be limited thereto.

Figure 2:
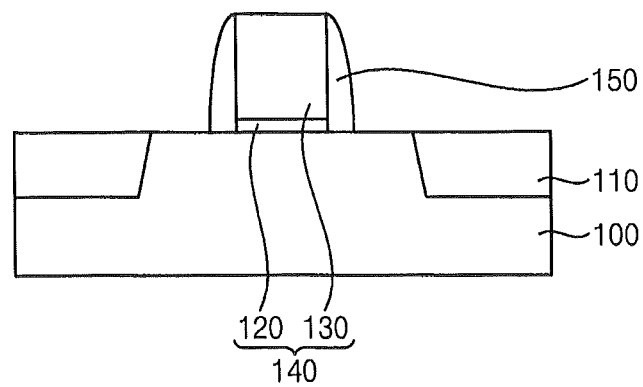

Referring to FIG. 2, an isolation layer 110 may be formed on a substrate 100, and a dummy gate structure 140 and an outer spacer 150 may be formed on the substrate 100 and the isolation layer 110.

The substrate 100 may be divided into a field region on which the isolation layer 110 is formed and an active region on which the isolation layer 110 is not formed. In example embodiments, the isolation layer 110 may be formed by a shallow trench isolation (STI) process.

The dummy gate structure 140 may be formed by sequentially stacking a gate insulation layer and a dummy gate electrode layer, and patterning the dummy gate electrode layer and the gate insulation layer through an etching process. Thus, the dummy gate structure 140 may be formed to include a gate insulation layer pattern 120 and a dummy gate electrode 130 sequentially stacked on the substrate 100 and the isolation layer 110. The dummy gate structure 140 may be formed only on the active region of the substrate 100, or may be also formed on the isolation layer 110 so as to be formed both on the active region and the field region of the substrate 100. In example embodiments, the dummy gate structure 140 may be formed to extend in a first direction on the substrate 100 and the isolation layer 110, and a plurality of dummy gate structures 140 may be formed in a second direction substantially perpendicular to the first direction.

The gate insulation layer may be formed by a chemical vapor deposition (CVD) process, an atomic layer deposition (ALD) process, etc. For example, the gate insulation layer may be formed to include silicon oxide. Alternatively, the gate insulation layer may be formed by a thermal oxidation process. The dummy gate electrode layer may be formed by a CVD process, an ALD process, etc. For example, the dummy gate electrode layer may be formed to include polysilicon.

An outer spacer layer covering the dummy gate structure 140 may be formed on the isolation layer 110 and the substrate 100, and etched by an anisotropic etching process to form the outer spacer 150 on a sidewall of the dummy gate structure 140. For example, the outer spacer layer may be formed to include silicon nitride or silicon oxide.

Figure 3:
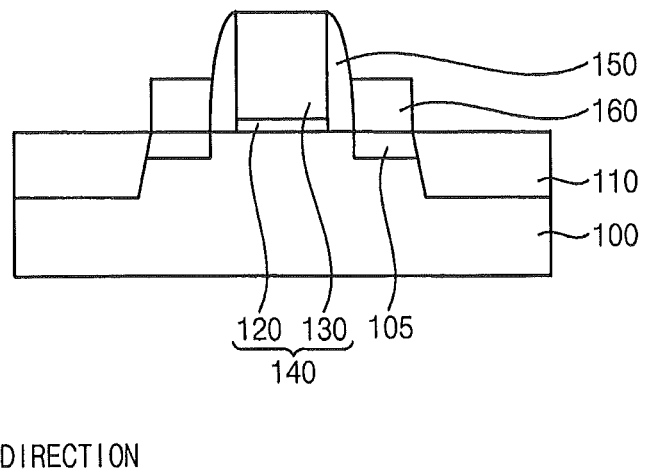

Referring to FIG. 3, an impurity region 105 may be formed at an upper portion of the active region of the substrate 100 adjacent to the dummy gate structure 140, and an elevated source drain (ESD) layer 160 may be formed on the impurity region 105.

Particularly, the active region of the substrate 100 may be partially removed using the dummy gate structure 140 and the outer spacer 150 as an etching mask to form a trench at an upper portion of the active region, and the impurity region 105 may be formed to fill the trench.

In example embodiments, a first selective epitaxial growth (SEG) process may be performed using a top surface of the substrate 100 exposed by the trench as a seed layer to form the impurity region 105. The first SEG process may be performed using, e.g., dichlorosilane ($SiH_2Cl_2$) gas or germane ($GeH_4$) gas as a source gas, and thus a single crystalline silicon-germanium layer may be formed. In example embodiments, p-type impurity source gas, e.g., diborane ($B_2H_6$) gas may be also used to form a single crystalline silicon-germanium layer doped with p-type impurities. In this case, the impurity region 105 may serve as a source/drain region of a PMOS transistor.

Alternatively, the first SEG process may be performed using disilane ($Si_2H_6$) gas and monomethylsilane ($SiH_3CH_3$) gas as a source gas to form a single crystalline silicon carbide layer. In example embodiments, n-type impurity source gas, e.g., phosphine (PH$_3$) gas may be also used to form a single crystalline silicon carbide layer doped with n-type impurities. In this case, the impurity region 105 may serve as a source/drain region of an NMOS transistor.

A second SEG process may be performed to form an ESD layer 160 on the impurity region 105. The second SEG process may be performed using the impurity region 105 as a seed layer. The second SEG process may be performed using p-type impurity source gas, e.g., dichlorosilane (SiH$_2$Cl$_2$) gas or diborane (B$_2$H$_6$) gas as a source gas, and thus a single crystalline silicon layer doped with p-type impurities may be formed. Alternatively, the second SEG process may be performed using n-type impurity source gas, e.g., dichlorosilane (SiH$_2$Cl$_2$) gas or phosphine (PH$_3$) gas as a source gas, and thus a single crystalline silicon layer doped with n-type impurities may be formed.

In example embodiments, the first SEG process for forming the impurity region 105 and the second SEG process for forming the ESD layer 160 may be performed in-situ. That is, when the impurity region 105 may be formed, a silicon source gas, a germanium source gas and a p-type impurity source gas may be provided to perform an SEG process, and providing the germanium source gas may be stopped to form the ESD layer 160. Alternatively, when the impurity region 105 may be formed, a silicon source gas, a carbon source gas and an n-type impurity source gas may be provided to perform an SEG process, and providing the carbon source gas may be stopped to form the ESD layer 160.

Until now, a method of forming the impurity region 105 in which the trench is formed and the SEG processes are performed, however, the impurity region 105 may be also formed by implanting impurities into an upper portion of the substrate 100 adjacent to the dummy gate structure 140. Additionally, the ESD layer 160 may not be formed. For the convenience of explanation, only the case in which the impurity region 105 is formed by the SEG processes and the ESD layer 160 is formed on the impurity region 105 will be illustrated hereinafter.

Figure 4:
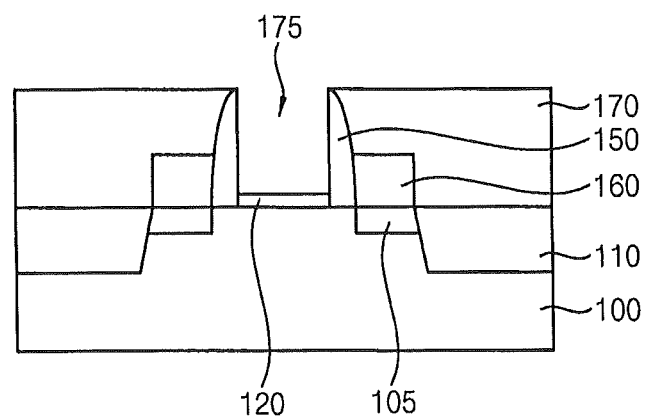

Referring to FIG. 4, a first insulating interlayer 170 covering the dummy gate structure 140, the outer spacer 150 and the ESD layer 160 may be formed on the substrate 100 and the isolation layer 110, and the first insulating interlayer 170 may be planarized until a top surface of the dummy gate structure 140 may be exposed. Before forming the first insulating interlayer 170, an etch stop layer may be further formed to include, e.g., silicon nitride on the dummy gate structure 140, the outer spacer 150 and the ESD layer 160

For example, the first insulating interlayer 170 may be formed to include silicon oxide. In example embodiments, the planarization process may be performed by a chemical mechanical polishing (CMP) process and/or an etch back process.

The exposed dummy gate electrode 130 may be removed to form a first opening 175, and a top surface of the gate insulation layer pattern 120 may be exposed. That is, the first opening 175 may be defined by the top surface of the gate insulation layer pattern 120 and an inner sidewall of the outer spacer 150. The dummy gate electrode 130 may be removed by a wet etching process or a dry etching process.

Figure 5:
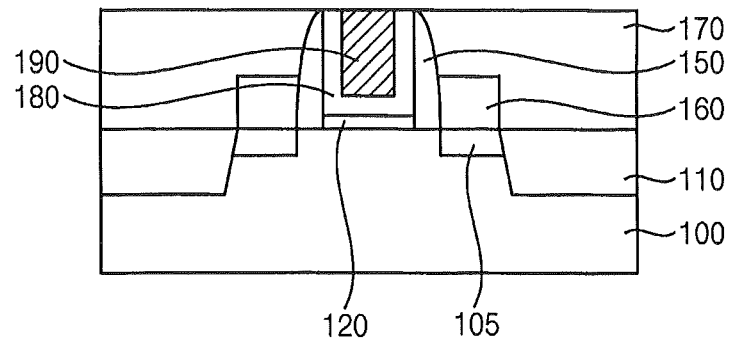

Referring to FIG. 5, a preliminary high-k dielectric layer pattern 180 may be formed on the exposed top surface of the gate insulation layer pattern 120 and the inner sidewall of the first opening 175, and a preliminary gate electrode 190 filling a remaining portion of the first opening 175 may be formed on the preliminary high-k dielectric layer pattern 180.

Particularly, a high-k dielectric layer may be formed on the exposed top surface of the gate insulation layer pattern 120, the inner sidewall of the first opening 175 and a top surface of the first insulating interlayer 170, and a first gate electrode layer sufficiently filling a remaining portion of the first opening 175 may be formed on the high-k dielectric layer.

The high-k dielectric layer may be formed by depositing a metal oxide having a high dielectric constant. The metal oxide may include, e.g., hafnium oxide, tantalum oxide, zirconium oxide, etc. The first gate electrode layer may be formed to include a low resistance metal, e.g., aluminum, copper, etc., or a metal nitride thereof by an ALD process, a physical vapor deposition (PVD) process, etc. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed. Alternatively, the first gate electrode layer may be formed to include doped polysilicon.

The first gate electrode layer and the high-k dielectric layer may be planarized until a top surface of the first insulating interlayer 170 may be exposed to form the preliminary high-k dielectric layer pattern 180 on the top surface of the gate insulation layer pattern 120 and the inner sidewall of the first opening 175, and the preliminary gate electrode 190 filling the remaining portion of the first opening 175 on the preliminary high-k dielectric layer pattern 180. In example embodiments, the planarization process may be performed by a CMP process and/or an etch back process.

Figure 6:
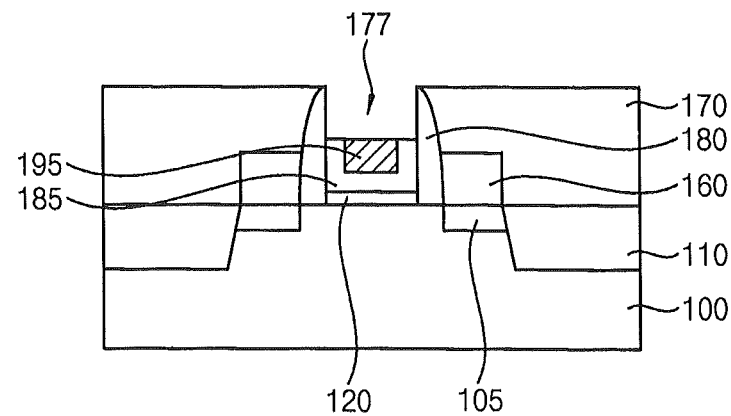

Referring to FIG. 6, upper portions of the preliminary gate electrode 190 and the preliminary high-k dielectric layer pattern 180 may be removed to form a recess 177, and thus a lower gate electrode 195 and a high-k dielectric layer pattern 185 may be formed. That is, the recess 177 may be defined by an upper inner sidewall of the outer spacer 150 and top surfaces of the lower gate electrode 195 and the high-k dielectric layer pattern 185.

Figure 7:
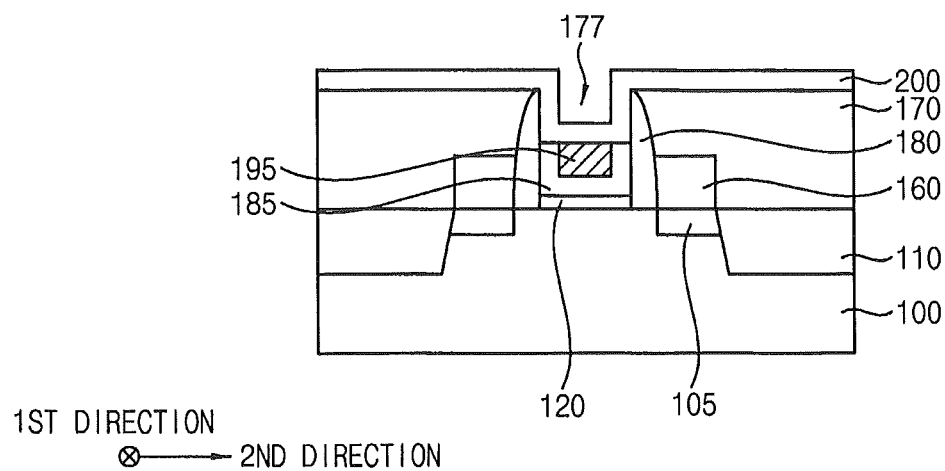

Referring to FIG. 7, a first inner spacer layer 200 may be formed on the top surfaces of the lower gate electrode 195 and the high-k dielectric layer pattern 185, a sidewall of the recess 177, and the top surface of the first insulating interlayer 170. In example embodiments, the first inner spacer layer 200 may be formed to have a thickness that may not substantially vary according to the position thereof.

The first inner spacer layer 200 may be formed to include a material having a dielectric constant lower than that of the high-k dielectric layer pattern 185. In example embodiments, the first inner spacer layer 200 may be formed to include silicon dioxide or a low-k dielectric material having a dielectric constant lower than silicon dioxide, e.g., silicon oxide doped with fluorine or carbon, porous silicon oxide, a spin on organic polymer, or an inorganic polymer such as (HSSQ, MSSQ, etc.

Figure 8:
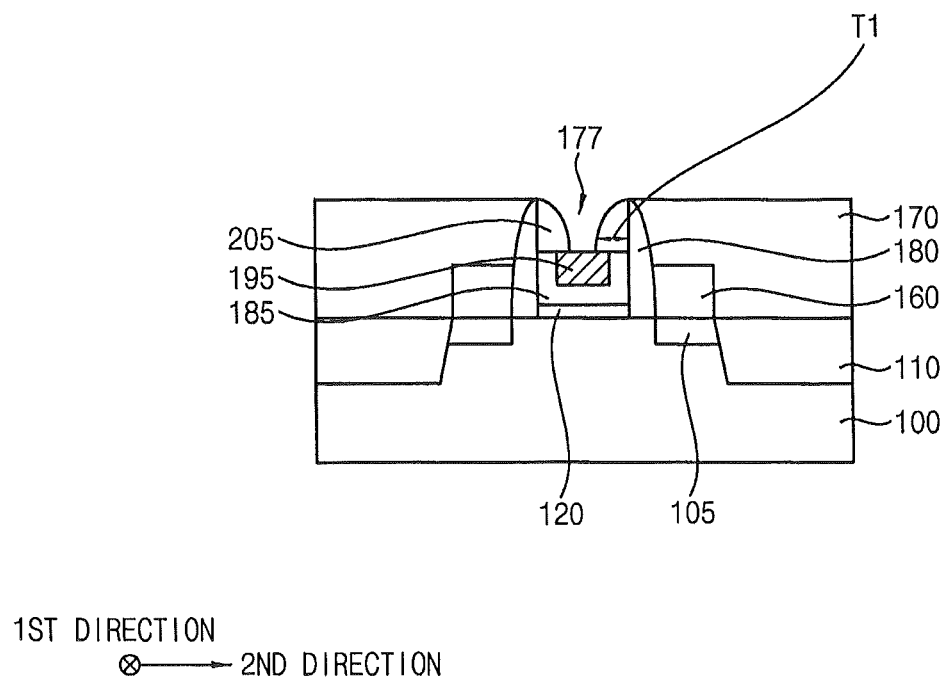

Referring to FIG. 8, the first inner spacer layer 200 may be partially removed to form a first inner spacer 205.

In example embodiments, the first inner spacer 205 may be formed by anisotropically etching the first inner spacer layer 200, and thus the first inner spacer 205 may be formed on the sidewall of the recess 177. The first inner spacer 205 may cover the top surface of the high-k dielectric layer pattern 185 and a portion of the top surface of the lower gate electrode 195.

Even though the first inner spacer layer 200 may be formed to have a thickness that may not substantially vary, according to the characteristics of the anisotropic etching process, the first inner spacer 205 may be formed to have a first thickness T1 along the second direction that may gradually increase from a top portion toward a bottom portion thereof, and thus a remaining portion of the recess 177 in which the first inner spacer 205 is formed may have a width along the second direction that may gradually decrease from a top portion toward a bottom portion thereof.

Figure 9:
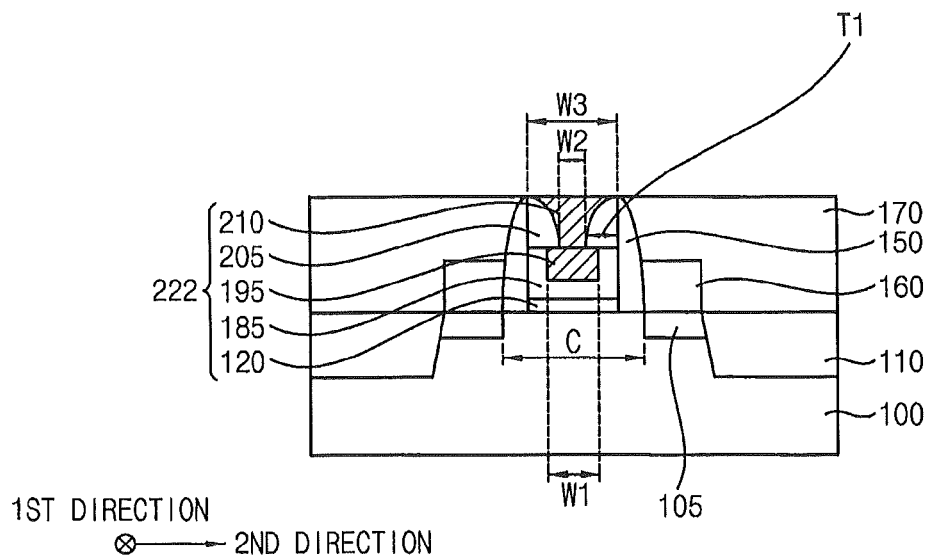

Referring to FIG. 9, an upper gate electrode 210 filling the remaining portion of the recess 177 may be formed on the lower electrode 195 and the first inner spacer 205.

In example embodiments, the upper gate electrode 210 may be formed by forming a second gate electrode layer sufficiently filling the remaining portion of the recess 177 on the lower gate electrode 195 and the first inner spacer 205, and planarizing the second gate electrode layer until a top surface of the first insulating interlayer 170 may be exposed.

According to the shape of the recess 177, the upper gate electrode 210 may have a width along the second direction that may gradually increase from a bottom portion toward a top portion thereof. Thus, a second width W2 of the bottom portion of the upper gate electrode 210 along the second direction may be lower than a first width W1 of the lower gate electrode 195 along the second direction, however, a third width W3 of the top portion of the upper gate electrode 210 may be greater than the first width W1 of the lower gate electrode 195. In example embodiments, the third width W3 of the top portion of the upper gate electrode 210 may be substantially the same as a width of a bottom surface of the high-k dielectric layer pattern 185 along the second direction.

The second gate electrode layer may be formed to include a metal having a low resistance such as aluminum, copper, tantalum, etc., or a metal nitride thereof, by an ALD process, a PVD process, etc. Alternatively, the second gate electrode layer may be formed to include doped polysilicon.

In example embodiments, the second gate electrode layer may be formed to include a material substantially the same as that of the first gate electrode layer so that the lower gate electrode 195 and the upper gate electrode 210 may be merged into one structure. Alternatively, the second gate electrode layer may be formed to include a material different from that of the first gate electrode layer.

By the above processes, a gate structure 222 including the gate insulation layer pattern 120, the high-k dielectric layer pattern 185, the lower gate electrode 195, the upper gate electrode 210 and the first inner spacer 205 may be formed on the substrate 100 and the isolation layer 110. The gate structure 222 and the impurity region 105 and the ESD layer 160 adjacent to the gate structure 222 may form a transistor, and the impurity region 105 and the ESD layer 160 may serve as a source/drain region of the transistor.

Figure 10:
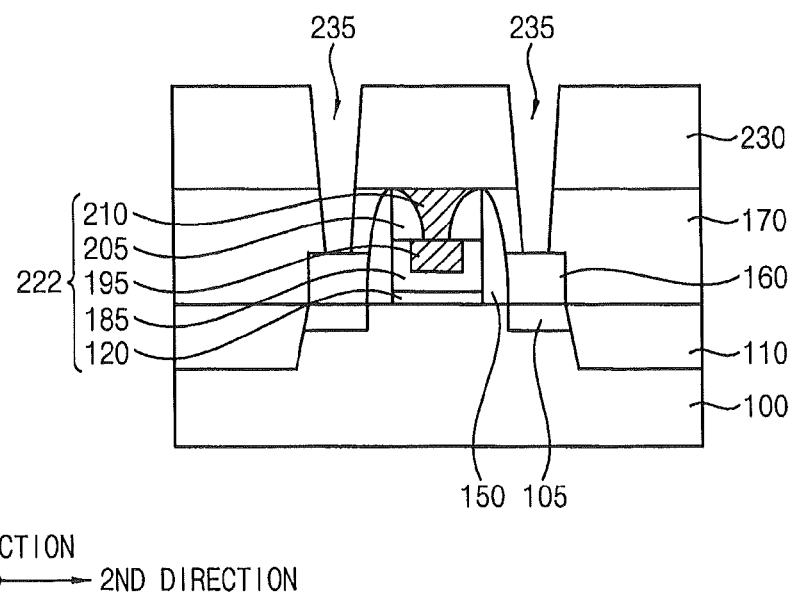

Referring to FIG. 10, a second insulating interlayer 230 may be formed on the first insulating interlayer 170 and the gate structure 222, and a second opening 235 may be formed through the first and second insulating interlayers 170 and 230 to expose a top surface of the ESD layer 160.

The second insulating interlayer 230 may be formed to include, e.g., silicon oxide. The second insulating interlayer 230 may be formed to include a material substantially the same as or different from that of the first insulating interlayer 170.

The second opening 235 may be formed by forming a photoresist pattern and performing a dry etch process using the photoresist pattern as an etching mask. In the dry etch process, an upper portion of the ESD layer 160 may be removed to form a recess.

Referring to FIG. 1 again, a metal silicide pattern 250 may be formed on the exposed top surface of the ESD layer 160.

Particularly, a metal layer may be formed on the exposed top surface of the ESD layer 160, a sidewall of the second opening 235 and a top surface of the second insulating interlayer 230 and thermally treated so that a silicidation process may be performed on the metal layer and the ESD layer 160. In an example embodiment, the heat treatment may be performed at a temperature of less than about 400° C.

Thus, a metal silicide layer may be formed on the ESD layer 160, and a portion of the metal layer that has not been reacted with the ESD layer 160 may be removed to form the metal silicide pattern 250 on the ESD layer 160. In example embodiments, the metal layer may be formed to include nickel, cobalt, platinum, etc., and the metal silicide pattern 250 may be formed to include nickel silicide, cobalt silicide, platinum silicide, etc.

A first contact plug 240 may be formed to fill the second opening 235.

The first contact plug 240 may be formed by forming a barrier layer on a top surface of the metal silicide pattern 250, the sidewall of the second opening 235 and the top surface of the second insulating interlayer 230, forming a conductive layer on the barrier layer to sufficiently fill a remaining portion of the second opening 235, and planarizing the conductive layer and the barrier layer until the top surface of the second insulating interlayer 230 may be exposed. In example embodiments, the barrier layer may be formed to include a metal or a metal nitride, and the conductive layer may be formed to include doped polysilicon, a metal, a metal nitride and/or a metal silicide.

By the above processes, the semiconductor device may be manufactured.

Figure 11:
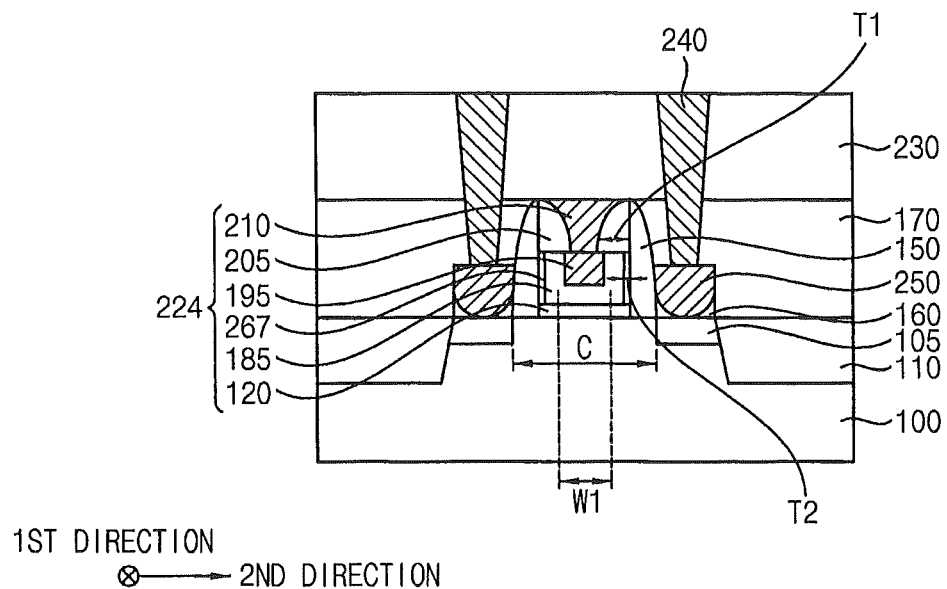

FIG. 11 is a cross-sectional view illustrating a semiconductor device in accordance with example embodiments. The semiconductor device may be substantially the same as or similar to that of FIG. 1, except that the semiconductor device may further include a second inner spacer. Thus, like reference numerals refer to like elements, and detail descriptions thereon are omitted herein.

Referring to FIG. 11, the semiconductor device may include a gate structure 224 on a substrate 100. Additionally, the semiconductor device may include an outer spacer 150, an impurity region 105, an elevated source drain (ESD) layer 160, a metal silicide pattern 250, a first contact plug 240, and first and second insulating interlayers 170 and 230.

The gate structure 224 may include a gate insulation layer pattern 120 on the substrate 100, lower and upper gate electrodes 195 and 210 sequentially stacked on the gate insulation layer pattern 120, and a first inner spacer 205 surrounding a sidewall of the upper gate electrode 210. Additionally, the gate structure 224 may include a high-k dielectric layer pattern 185, which may be formed on the gate insulation layer pattern 120 and surround a bottom and a sidewall of the lower gate electrode 195, and a second inner spacer 267, which may be formed on the gate insulation layer pattern 120 and surround a sidewall of the high-k dielectric layer pattern 185.

The second inner spacer 267 may have a second thickness T2 along the second direction. In example embodiments, the second thickness T2 may be smaller than a width of the high-k dielectric layer pattern 185 or a first thickness T1 of the first inner spacer 205.

The second inner spacer 267 may include a material having a dielectric constant lower than that of the high-k dielectric layer pattern 185. For example, the second inner spacer 267 may include silicon dioxide or a low-k dielectric material having a dielectric constant lower than that of silicon dioxide. In an example embodiment, the second inner spacer 267 may include an ALD oxide.

In the semiconductor device, a leakage current may be decreased due to the high-k dielectric layer pattern 185, and a parasitic capacitance may be decreased due to the first inner spacer 205.

Additionally, the semiconductor device may further include the second inner spacer 267 so that a first width W1 of the lower gate electrode 195 may be controlled in accordance with the second thickness T2 of the second inner spacer 267. That is, when the second inner spacer 267 is formed, as the second thickness T2 of the second inner spacer 267 increases, the first width W1 of the lower gate electrode 195 may decrease. Thus, the effect of the lower gate electrode 195 on the electric field of the channel C at an upper portion of the substrate 100 may be controlled, and the semiconductor device may have desired characteristics, e.g., an increased drain current using the effect.

FIGS. 12 to 15 are cross-sectional views illustrating stages of a method of manufacturing a semiconductor device. This method may be used for forming the semiconductor device of FIG. 11, however, may not be limited thereto. Additionally, this method may include processes substantially the same as or similar to those illustrated with reference to FIGS. 2 to 10, and thus detailed descriptions thereon are omitted herein.

First, processes substantially the same as or similar to those illustrated with reference to FIGS. 2 to 4 may be performed.

Figure 12:
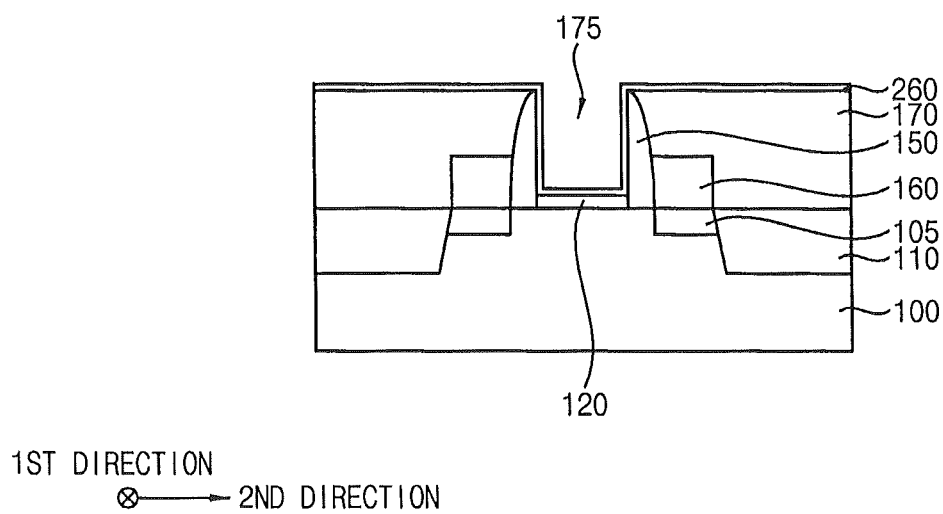

Referring to FIG. 12, a second inner spacer layer 260 may be formed on the exposed top surface of the gate insulation layer pattern 120, a sidewall of the first opening 175 and a top surface of the first insulating interlayer 170.

In example embodiments, the second inner spacer layer 260 may be formed by an ALD process to have a thickness that may not substantially vary according to a position thereof, and the thickness of the second inner spacer layer 260 may be minutely controlled. The second inner spacer layer 260 may be formed to include, e.g., silicon dioxide, or a low-k dielectric material having a dielectric constant lower than that of silicon dioxide.

Figure 13:
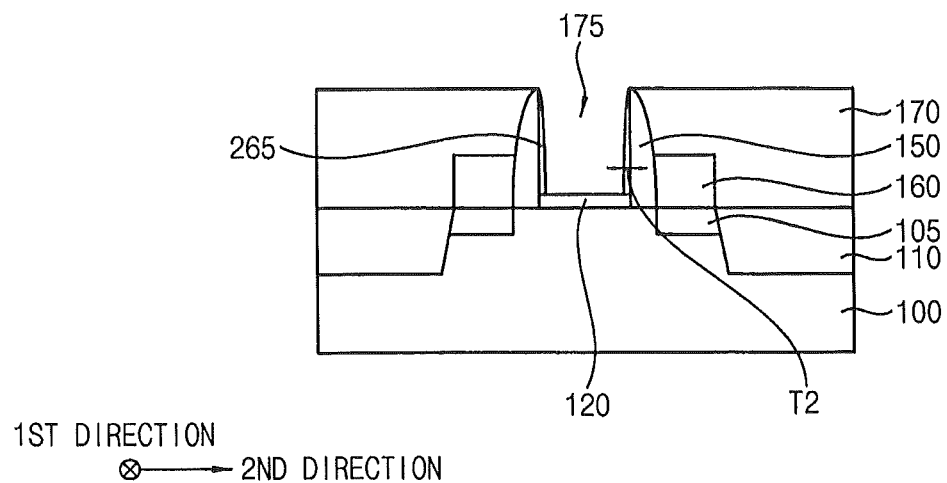

Referring to FIG. 13, the second inner spacer layer 260 may be anisotropically etched to form a preliminary second inner spacer 265 on a sidewall of the first opening 175. Thus, the preliminary second inner spacer 265 having a second thickness T2 along the second direction may be formed on an edge portion of the gate insulation pattern 120. Due to the characteristics of the anisotropic etching process, the second thickness T2 of the preliminary second inner spacer 265 may gradually increase from a top portion of the preliminary second inner spacer 265 toward a bottom portion thereof, however, the preliminary second inner spacer 265 may have such a small thickness that the increase may be very small.

Figure 14:
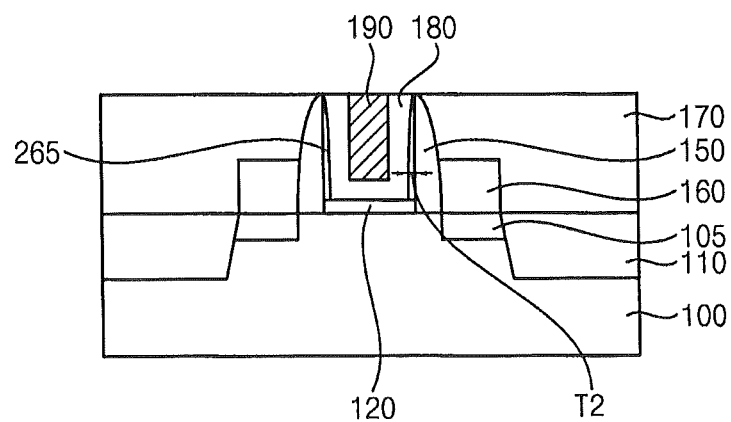

Referring to FIG. 14, a process substantially the same as or similar to that illustrated with reference to FIG. 5 may be performed so that a preliminary high-k dielectric layer pattern 180 may be formed on a top surface of the gate insulation layer pattern 120 and a sidewall of the preliminary second inner spacer 265, and a preliminary gate electrode 190 may be formed on the preliminary high-k dielectric layer pattern 180 to fill a remaining portion of the first opening 175.

Figure 15:
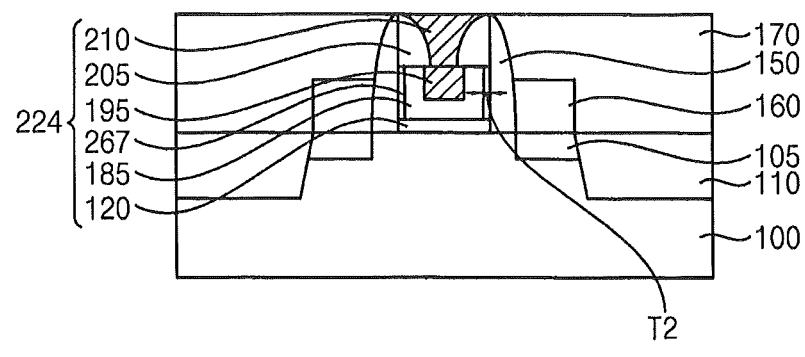

Referring to FIG. 15, processes substantially the same as or similar to those illustrated with reference to FIGS. 6 to 9 may be performed so that a first inner spacer 205 and an upper gate electrode layer 210 may be formed.

Referring to FIG. 11 again, processes substantially the same as or similar to those illustrated with reference to FIGS. 10 and 1 may be performed so that an ESD layer 160, a metal silicide pattern 250, first and second insulating interlayers 170 and 230, and a first contact plug 240 may be formed. Thus, the semiconductor device may be manufactured.

Figure 16:
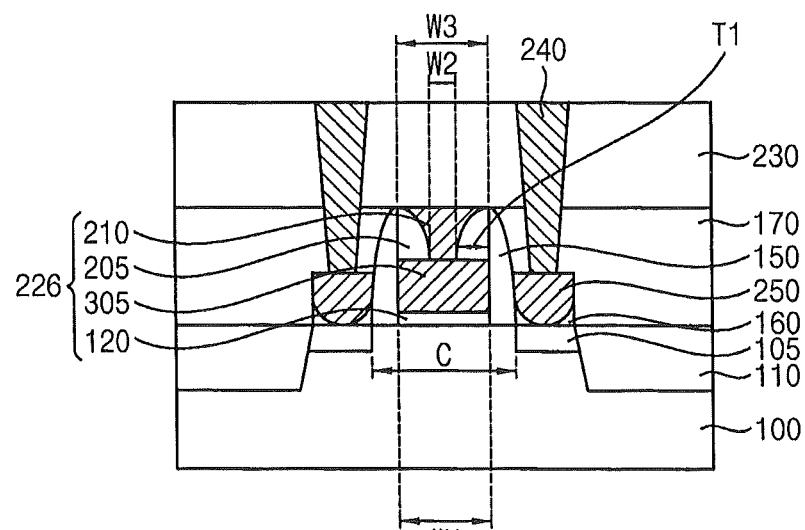

FIG. 16 is a cross-sectional view illustrating a semiconductor device in accordance with example embodiments. The semiconductor device may be substantially the same as or similar to that of FIG. 1, except for the lower and upper gate electrodes and the high-k dielectric layer pattern. Thus, like reference numerals refer to like elements, and detail descriptions thereon are omitted herein.

Referring to FIG. 16, the semiconductor device may include a gate structure 226 on a substrate 100. Additionally, the semiconductor may include an outer spacer 150, an impurity region 105, an elevated source drain (ESD) layer 160, a metal silicide pattern 250, a first contact plug 240, and first and second insulating interlayers 170 and 230.

The gate structure 226 may include a gate insulation layer pattern 120 on the substrate 100, lower and upper gate electrodes 305 and 210 sequentially stacked on the gate insulation layer pattern 120, and a first inner spacer 205 surrounding a sidewall of the upper gate electrode 210.

The lower gate electrode 305 may have a first width W1 along the second direction. The first width W1 of the lower gate electrode 305 may be substantially the same as a width of the gate insulation layer pattern 120 along the second direction. A width of the upper gate electrode 210 along the second direction may gradually increase from a bottom portion toward a top portion thereof, and a bottom portion of the upper gate electrode 210 may have a second width W2 that may be smaller than the first width W1 of the lower gate electrode 305. Thus, a third width W3 of the top portion of the upper gate electrode 210 may be substantially the same as the first width W1 of the lower gate electrode 305 or a width of the gate insulation layer pattern 120.

The lower and upper gate electrodes 305 and 210 may include polysilicon doped with impurities. Alternatively, the lower and upper gate electrodes 305 and 210 may include a material having a low resistance, e.g., a metal such as aluminum, copper, tantalum, etc., or a metal nitride thereof. In example embodiments, the lower and upper gate electrodes 305 and 210 may include substantially the same material to be merged to each other. Alternatively, the lower and upper gate electrodes 305 and 210 may include different materials from each other.

The semiconductor device may have a reduced parasitic capacitance due to the first inner spacer 205. That is, due to the existence of the first inner spacer 205, a distance between the upper gate electrode 210 and the neighboring first contact plug 240 may increase so as to reduce the parasitic capacitance therebetween.

The lower gate electrode 305 that may directly affect an electric field of the channel C at the upper portion of the substrate 100 may have the first width W1 along the second direction, which may not substantially vary vertically regardless of the first inner spacer 205. Thus, the semiconductor device may keep the desired electrical characteristics regardless of the shape of the upper gate electrode 210 and/or the existence of the first inner spacer 205.

Figure 17:
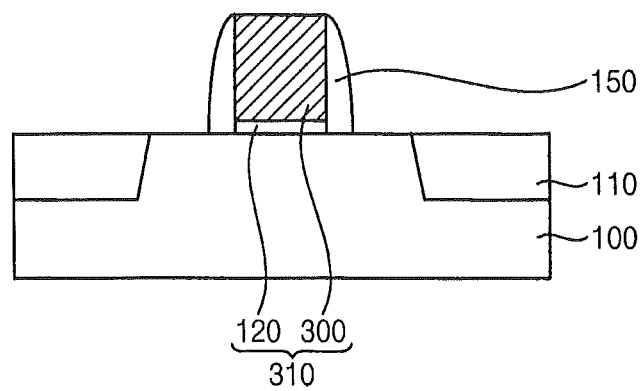
Figure 18:
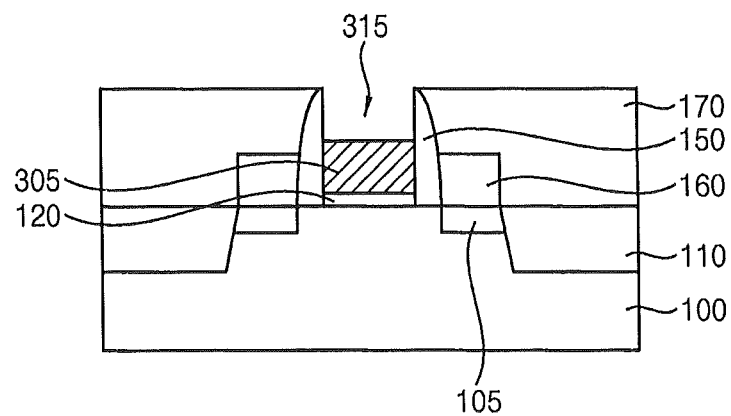
Figure 19:
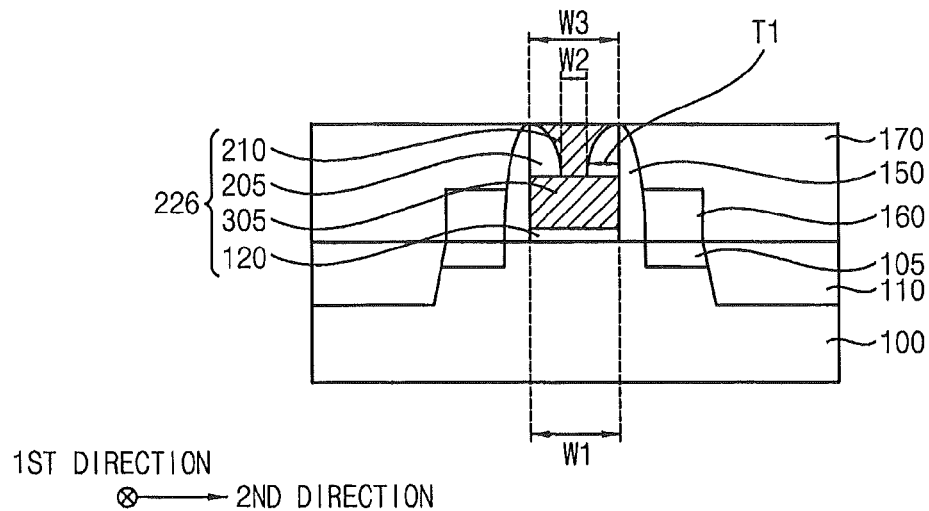

FIGS. 17 to 19 are cross-sectional views illustrating stages of a method of manufacturing a semiconductor device. This method may be used for forming the semiconductor device of FIG. 16, however, may not be limited thereto. Additionally, this method may include processes substantially the same as or similar to those illustrated with reference to FIGS. 2 to 10 may be performed, and thus detailed descriptions thereon are omitted herein.

Referring to FIG. 17, a process substantially the same as or similar to that illustrated with reference to FIG. 2 may be performed.

However, instead of the dummy gate electrode 130 including polysilicon, a preliminary gate electrode 300 may be formed on the gate insulation layer pattern 120 to include doped polysilicon, a metal, a metal nitride, etc. Thus, the gate insulation layer pattern 120 and the preliminary gate electrode 300 may form a preliminary gate structure 310, and an outer spacer 150 may be formed on a sidewall of the preliminary gate structure 310.

Referring to FIG. 18, a process substantially the same as or similar to that illustrated with reference to FIG. 6 may be performed.

However, the preliminary high-k dielectric layer pattern 180 may not be formed, and thus a recess 315 may be formed by partially removing only the preliminary gate electrode 300.

Referring to FIG. 19, processes substantially the same as or similar to those illustrated with reference to FIGS. 7 to 9 may be performed. Thus, an upper gate electrode 210 and a first inner spacer 205 may be formed.

Thus, a lower gate electrode 305 having a first width W1 along the second direction that may be substantially the same as a width of the gate insulation layer pattern 120, and an upper gate electrode 210 having a width varying according to a first thickness T1 of the first inner spacer 205 may be formed. A second width W2 of a bottom portion of the upper gate electrode 210 may be smaller than the first width W1 of the lower gate electrode 305, and a third width W3 of a top portion of the upper gate electrode 210 may be substantially the same as the first width W1 of the lower gate electrode 305.

Referring to FIG. 16 again, processes substantially the same as or similar to those illustrated with reference to FIGS. 10 and 1 may be performed. Thus, an ESD layer 160, a metal silicide pattern 250, first and second insulating interlayers 170 and 230 and a first contact plug 240 may be formed to complete the semiconductor device.

Figure 20:
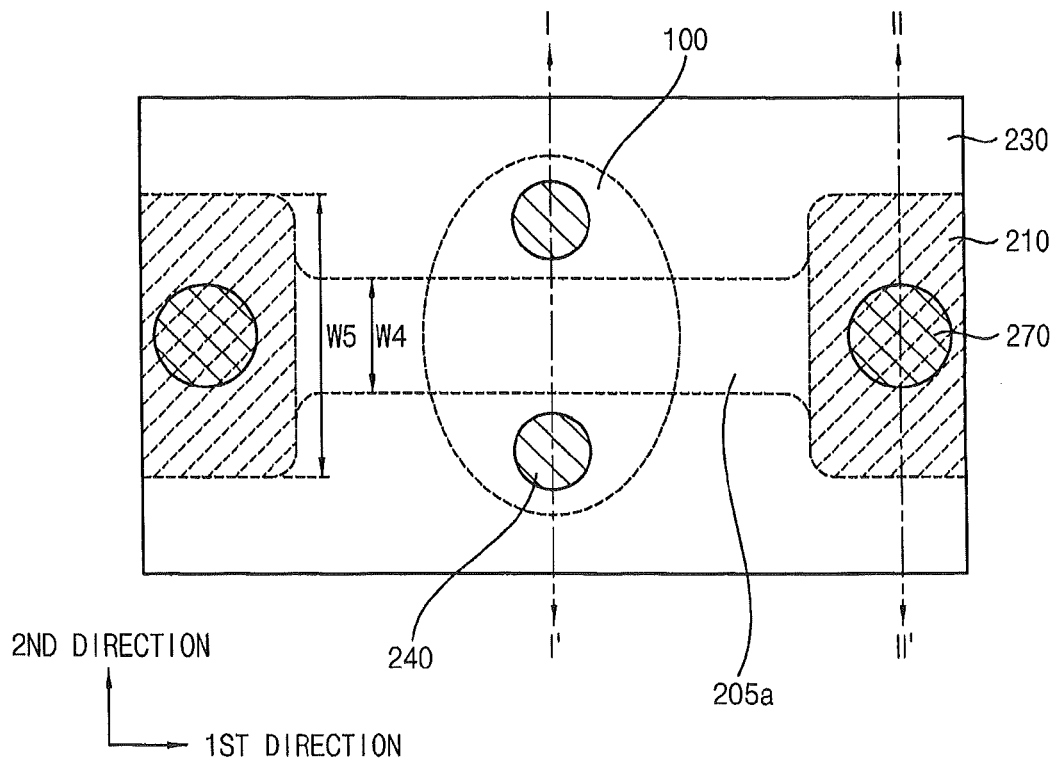
Figure 21A:
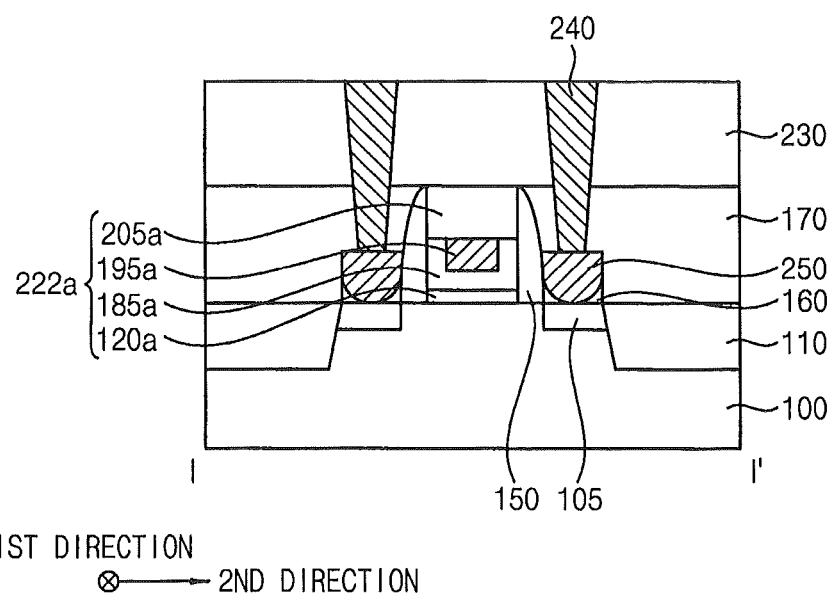
FIGS. 21A and 21B are cross-sectional views of the semiconductor device of FIG. 20 according to example embodiments of present inventive concepts.
Figure 21B:
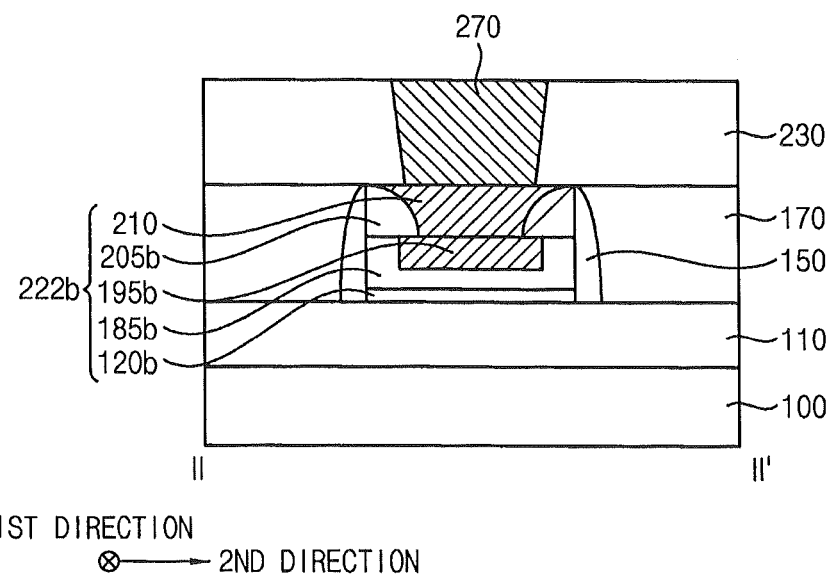

FIG. 20 is a plan view illustrating a semiconductor device in accordance with example embodiments, and FIGS. 21A and 21B are cross-sectional views of the semiconductor device of FIG. 20. Particularly, FIGS. 21A and 21B are cross-sectional views cut along a line I-I' and a line II-II', respectively. The semiconductor device may be substantially the same as that of FIG. 1, except for the width of the gate structure, the first inner spacer, and the upper gate electrode, and the contact plug. Thus, like reference numerals refer to like elements, and detailed descriptions thereon may be omitted herein.

Referring to FIGS. 20, 21A and 21B, the semiconductor device may include first and second gate structures 222a and 22b on a substrate 100. Additionally, the semiconductor may include an outer spacer 150, an impurity region 105, an elevated source drain (ESD) layer 160, a metal silicide pattern 250, first and second contact plugs 240 and 270, and first and second insulating interlayers 170 and 230.

The substrate 100 may be divided into a field region on which an isolation layer 110 is formed and an active region on which no isolation layer is formed. In example embodiments, the first gate structure 222a may extend in a first direction on the substrate 100, and may be formed on at least the active region of the substrate 100 and a portion of the first gate structure 222a may be formed on the isolation layer 110. The second gate structure 222b may directly contact the first gate structure 222a, and may be formed on the isolation layer 110. In example embodiments, a plurality of first and second gate structures 222a and 222b connected to each other may be formed in a second direction substantially perpendicular to the first direction.

The first gate structure 222a may include a first gate insulation layer pattern 120a on the substrate 100, a first high-k dielectric layer pattern 185a on the first gate insulation layer pattern 120a, a first lower gate electrode 195a of which a bottom and a sidewall may be surrounded by the first high-k dielectric layer pattern 185a, and an inner spacer layer 205a on the first lower gate electrode 195a and the first high-k dielectric layer pattern 185a.

The second gate structure 222b may include a second gate insulation layer pattern 120b on the substrate 100, a second high-k dielectric layer pattern 185b on the second gate insulation layer pattern 120b, a second lower gate electrode 195b of which a bottom and a sidewall may be surrounded by the second high-k dielectric layer pattern 185b, an upper gate electrode 210 on the second lower gate electrode 195b, and an inner spacer 205b surrounding a sidewall of the upper gate electrode 210 on the second lower gate electrode 195b and the second high-k dielectric layer pattern 185b.

A fifth width W5 along the second direction of the second gate structure 222b may be greater than a fourth width W4 along the second direction of the first gate structure 222a. That is, the second gate insulation layer pattern 120b, the second high-k dielectric layer pattern 185b and the second lower gate electrode 195b may have widths greater (e.g., wider) than those of the first gate insulation layer pattern 120a, the first high-k dielectric layer pattern 185a and the first lower gate electrode 195a, respectively.

The second gate insulation layer pattern 120b, the second high-k dielectric layer pattern 185b, and the second lower gate electrode 195b may have materials substantially the same as those of the first gate insulation layer pattern 120a, the first high-k dielectric layer pattern 185a, and the first lower gate electrode 195a, respectively.

The second contact plug 270 may be formed through the second insulating interlayer 230 on the upper gate electrode 210. The second contact plug 270 may include a material substantially the same as that of the first contact plug 240, e.g., a metal, a metal nitride, doped polysilicon, etc.

Like the gate structure 222 of FIG. 1, the second gate structure 222b included in the semiconductor device of FIGS. 20, 21A and 21B may include the second high-k dielectric layer pattern 185b between the second gate insulation layer pattern 120b and the second lower gate electrode 195b so as to have a reduced leakage current. Additionally, the second gate structure 222b may include the inner spacer 205b surrounding a sidewall of the upper gate electrode 210 and including a low-k dielectric material, so that a parasitic capacitance between the second gate structure 222b and the first contact plug 240 may be reduced. Furthermore, the second lower gate electrode 195b may have the fifth width W5 that may not substantially vary along the second direction regardless of the inner spacer 205b, the semiconductor device may keep the electrical characteristics with no influence of the inner spacer 205b and the upper gate electrode 210.

The upper gate electrode 210 included in the second gate structure 222b may have a width that may gradually increase from a bottom portion toward a top portion thereof, and thus may be easily contact the second contact plug 270.

The first gate structure 222a included in the semiconductor device may include only the inner spacer layer 205a on the first lower gate electrode 195a with no upper gate electrode, and thus the parasitic capacitance between the first gate structure 222a and the neighboring first contact plug 240 may be sufficiently reduced.

Figure 22:
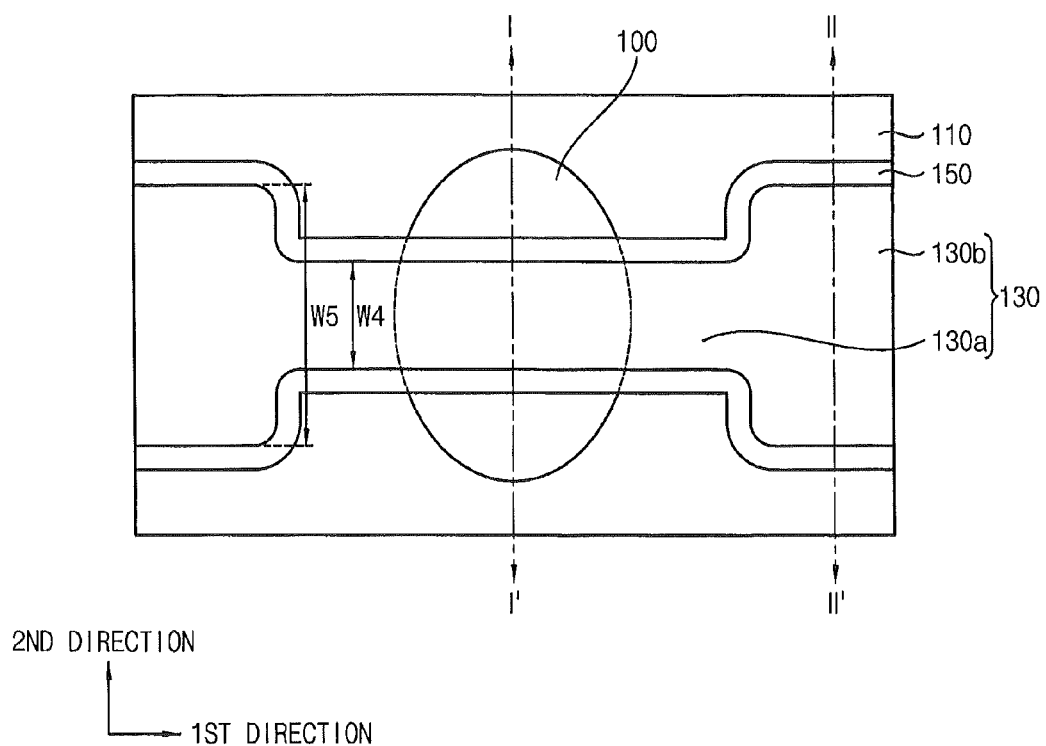
Figure 23A:
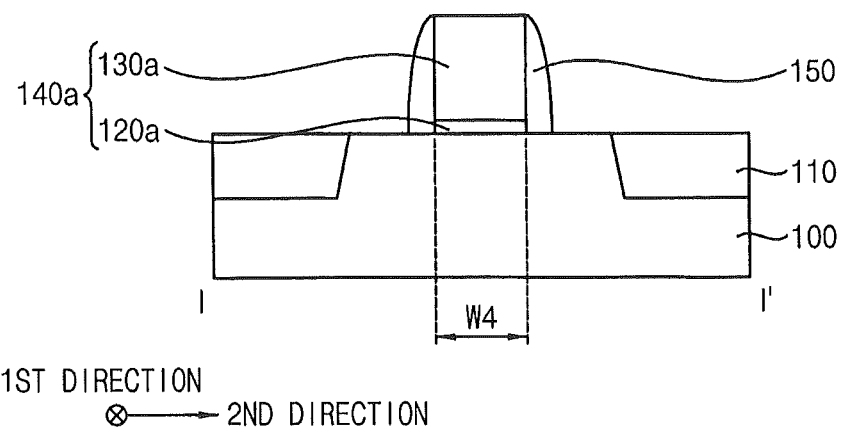
FIGS. 23A, 23B, 25A, 25B and 27A, 27B are corresponding cross-sectional views of FIGS. 22, 24 and 26, respectively, according to example embodiments of present inventive concepts.
Figure 23B:
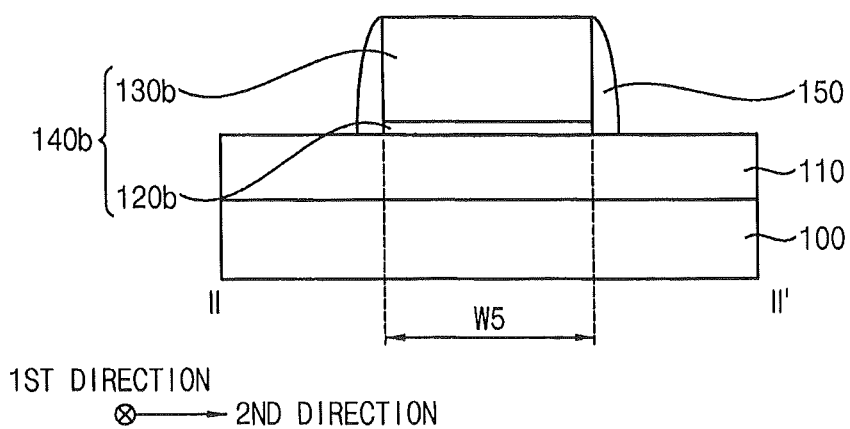
Figure 24:
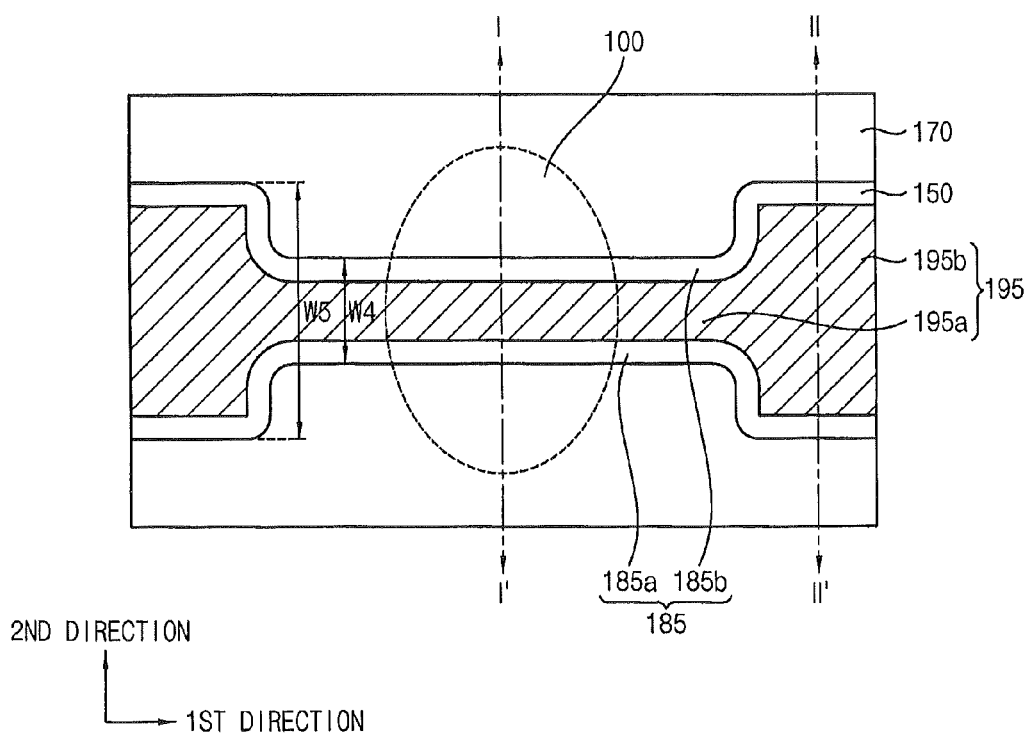
Figure 25A:
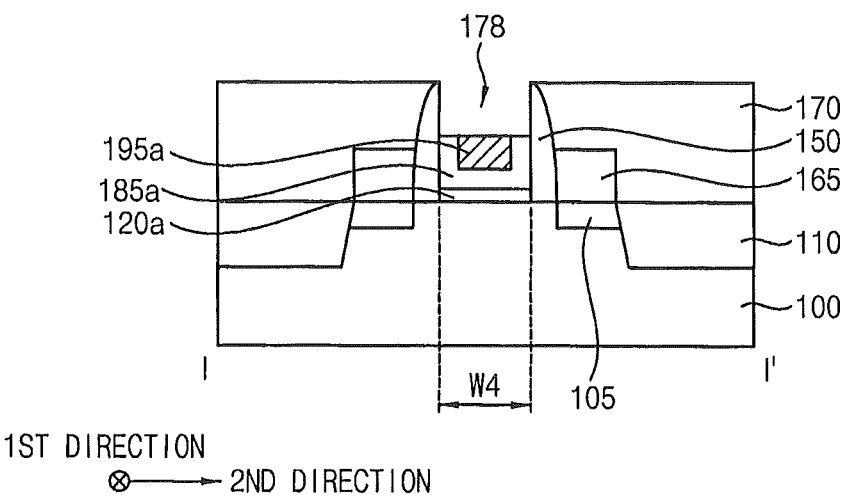
Figure 25B:
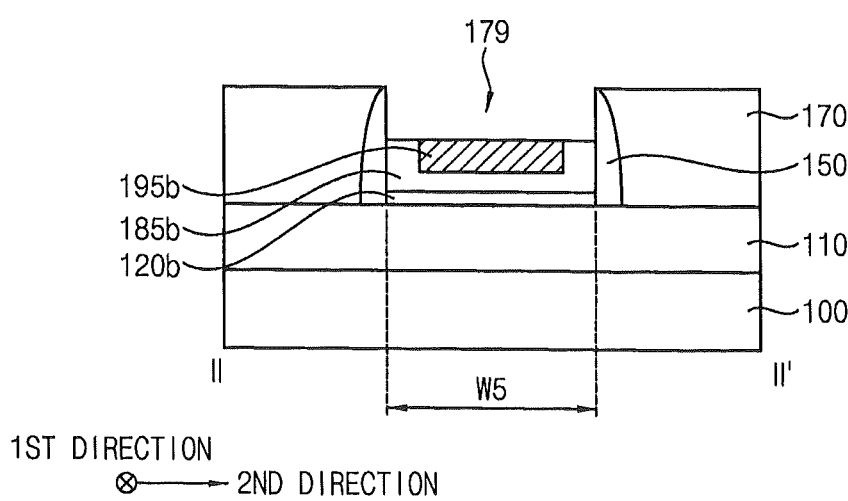
Figure 27A:
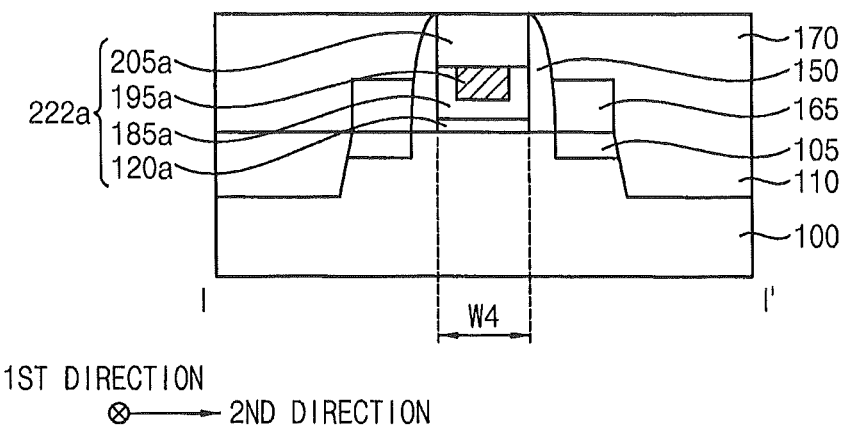
Figure 27B:
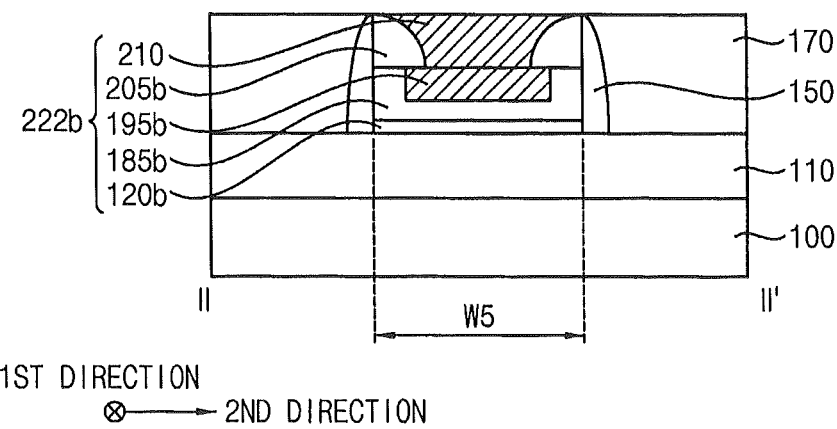

FIGS. 22, 24 and 26 are plan views illustrating stages of a method of manufacturing a semiconductor device, and FIGS. 23A, 23B, 25A, 25B and 27A, 27B are cross-sectional views of the semiconductor device. Particularly, FIGS. 23A, 25A and 27A are corresponding cross-sectional views of the semiconductor device cut along a line I-I' of FIGS. 22, 24 and 26, respectively, and FIGS. 23B, 25B and 27B are corresponding cross-sectional views of the semiconductor device cut along a line II-II' of FIGS. 22, 24 and 26, respectively. This method may be used for forming the semiconductor device of FIGS. 20, 21A and 21B, however, may not be limited thereto. Additionally, this method may include processes substantially the same as or similar to those illustrated with reference to FIGS. 2 to 10 may be performed, and thus detailed descriptions thereon are omitted herein.

Referring to FIGS. 22, 23A and 23B, a process substantially the same as or similar to that illustrated with reference to FIG. 2 may be performed.

That is, a gate insulation layer and a dummy gate electrode layer may be formed on a substrate 100 and an isolation layer 110, and may be patterned. However, the dummy gate electrode layer and the gate insulation layer on the active region of the substrate 100 and a portion of the isolation layer 110 adjacent thereto may be patterned to have a fourth width W4 that may be relatively narrow along the second direction, and the dummy gate electrode layer and the gate insulation layer on a remaining portion of the isolation layer 110 may be patterned to have a fifth width W5 that may be relatively wide along the second direction.

Thus, a first dummy gate electrode structure 140a including a first gate insulation layer pattern 120a and a first dummy gate electrode 130a sequentially stacked on the substrate 100 and the portion of the isolation layer 110 may be formed, and a second dummy gate electrode structure 140b including a second gate insulation layer pattern 120b and a second dummy gate electrode 130b sequentially stacked on the remaining portion of the isolation layer 110 may be formed.

Additionally, an outer spacer 150 may be formed on sidewalls of the first and second dummy gate structures 140a and 140b.

Referring to FIGS. 24, 25A and 25B, processes substantially the same as or similar to those illustrated with reference to FIGS. 3 to 6 may be performed.

Thus, an impurity region 105 and an ESD layer 160 may be formed on the active region of the substrate 100 adjacent to the first dummy gate structure 140a.

A first lower gate electrode 195a and a first high-k dielectric layer pattern 185a may be formed on the first gate insulation layer pattern 120a, and a first recess 178 may be formed thereon. The fourth width W4 of the first recess 178 may be smaller than the fifth width W5 of the second recess 179.

Referring to FIGS. 26, 27A and 27B, processes substantially the same as or similar to those illustrated with reference to FIGS. 7 to 9 may be performed.

That is, an inner spacer layer 205a may be formed on top surfaces of the first and second lower gate electrodes 195a and 195b and the first and second high-k dielectric layer patterns 185a and 185b, sidewalls of the first and second recesses 178 and 179, and a top surface of the first insulating interlayer 170, and anisotropically etched to form the inner spacer 205b on the sidewall of the second recess 179.

However, the fourth width W4 of the first recess 178 may be narrower than the fifth width W5 of the second recess 179, and thus the inner spacer layer 205a may fill the whole portion of the first recess 178 so that the inner spacer layer 205a may not be etched in the first recess 178. Thus, the inner spacer layer 205a may remain in the first recess 178.

An upper gate electrode 210 may be formed on the second lower gate electrode 195b and the inner spacer 205b to fill a remaining portion of the second recess 179.

Referring to FIGS. 20, 21A and 21B, processes substantially the same as or similar to those illustrated with reference to FIGS. 10 and 1 may be performed.

Thus, a metal silicide pattern 250 may be formed on the ESD layer 160, and a first contact plug 240 may be formed on the metal silicide pattern 250. By the process for forming the first contact plug 240, a second contact plug 270 may be formed on the upper gate electrode 210. The upper gate electrode 210 may have a width that may gradually increase from a bottom portion toward a top portion thereof, and the second contact plug 270 may be easily formed to contact the upper gate electrode 210.

By the above processes, the semiconductor device may be manufactured.

Figure 28:
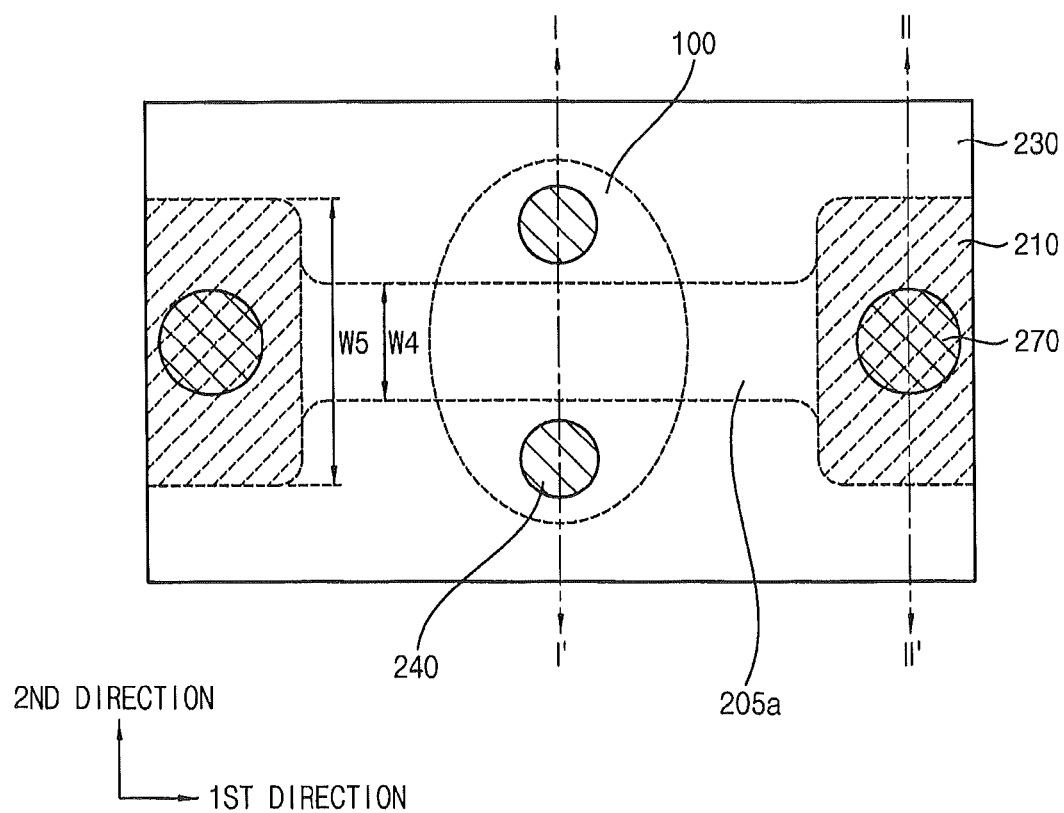
Figure 29A:
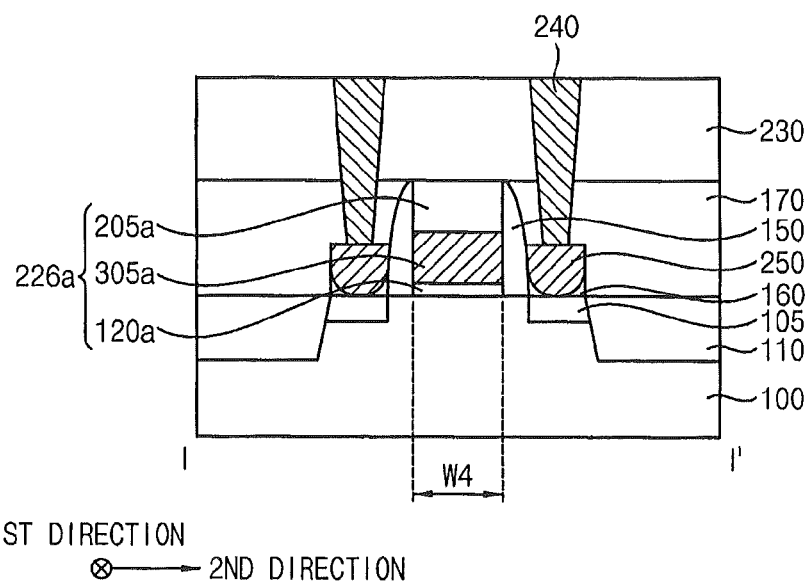
FIGS. 29A and 29B are cross-sectional views of the semiconductor device of FIG. 28 according to example embodiments of present inventive concepts.
Figure 29B:
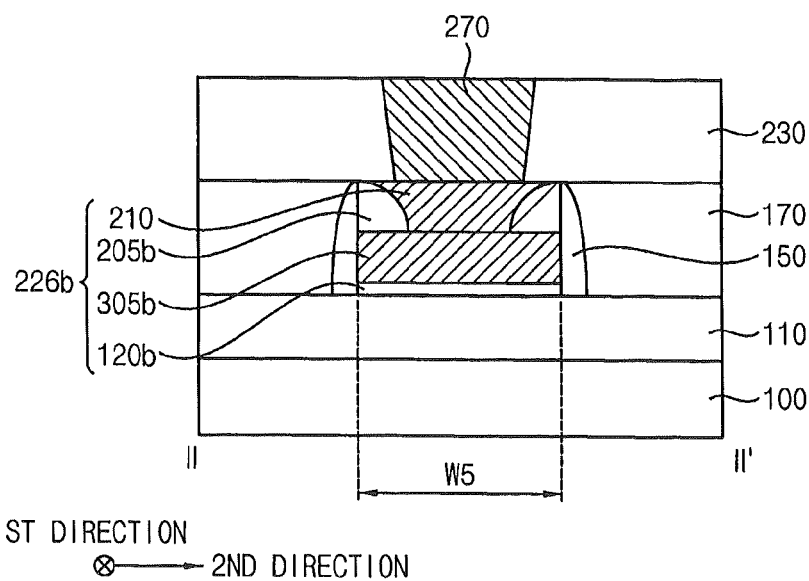

FIG. 28 is a plan view illustrating a semiconductor device in accordance with example embodiments, and FIGS. 29A and 29B are cross-sectional views of the semiconductor device of FIG. 28. Particularly, FIGS. 29A and 29B are cross-sectional views of the semiconductor device cut along a line I-I' and a line II-II', respectively, of FIG. 28. The semiconductor device may be substantially the same as or similar to that of FIG. 16, except for the width of the gate structure, the first inner spacer, the upper gate electrode and the contact plug. Additionally, the semiconductor device may be substantially the same as or similar to that of FIGS. 20, 21A and 21B, except for the lower and upper gate electrodes and the high-k dielectric layer pattern. Thus, like reference numerals refer to like elements, and detail descriptions thereon are omitted herein.

Referring to FIGS. 28, 29A and 29B, the semiconductor device may include first and second gate structures 226a and 226b on a substrate 100. Additionally, the semiconductor device may include an outer spacer 150, an impurity region 105, an elevated source drain (ESD) layer 160, a metal silicide pattern 250, first and second contact plugs 240 and 270, and first and second insulating interlayers 170 and 230.

The first gate structure 226a may extend in the first direction to be formed at least on the active region of the substrate 100, and further be formed on a portion of the isolation layer 110. The second gate structure 226b may directly contact the first gate structure 226a and be formed on the isolation layer 110.

The first gate structure 226a may include a first gate insulation layer pattern 120a, a first lower gate electrode 305a and an inner spacer layer 205a sequentially stacked on the substrate 100 and the isolation layer 110.

The second gate structure 226b may include a second gate insulation layer pattern 120b, a second lower gate electrode 305b on the second gate insulation layer pattern 120b, an upper gate electrode 210 on the second lower gate electrode 305b, and an inner spacer 205b surrounding a sidewall of the upper gate electrode 210 on a portion of a top surface of the second lower gate electrode 305b.

A fifth width W5 of the second gate structure 226b may be greater than a fourth width W4 of the first gate structure 226a. That is, the second gate insulation layer pattern 120b and the second lower gate electrode 305b may have widths greater than those of the first gate insulation layer pattern 120a and the first lower gate electrode 305a, respectively.

Like the gate structure 226 of FIG. 16, the second gate structure 222b included in the semiconductor device may include the inner spacer 205b surrounding a sidewall of the upper gate electrode 210 and including a low-k dielectric material, and thus the parasitic capacitance between the second gate structure 226b and the first contact plug 240 may be reduced. Additionally, the second lower gate electrode 305b may have the fifth width W5 along the second direction regardless of the inner spacer 205b, so that the semiconductor device may keep the desired electrical characteristics with no influence of the inner spacer 205b and the upper gate electrode 210.

Furthermore, the upper gate electrode 210 included in the second gate structure 226b may have the width that may gradually increase from a bottom portion toward a top portion thereof, and thus may easily contact the second contact plug 270.

The first gate structure 226a included in the semiconductor device may include only the inner spacer layer 205a with no upper gate electrode on the lower gate electrode 305a, and thus the parasitic capacitance between the first gate structure 226a and the neighboring contact plug 240 may be sufficiently reduced.

Figure 30:
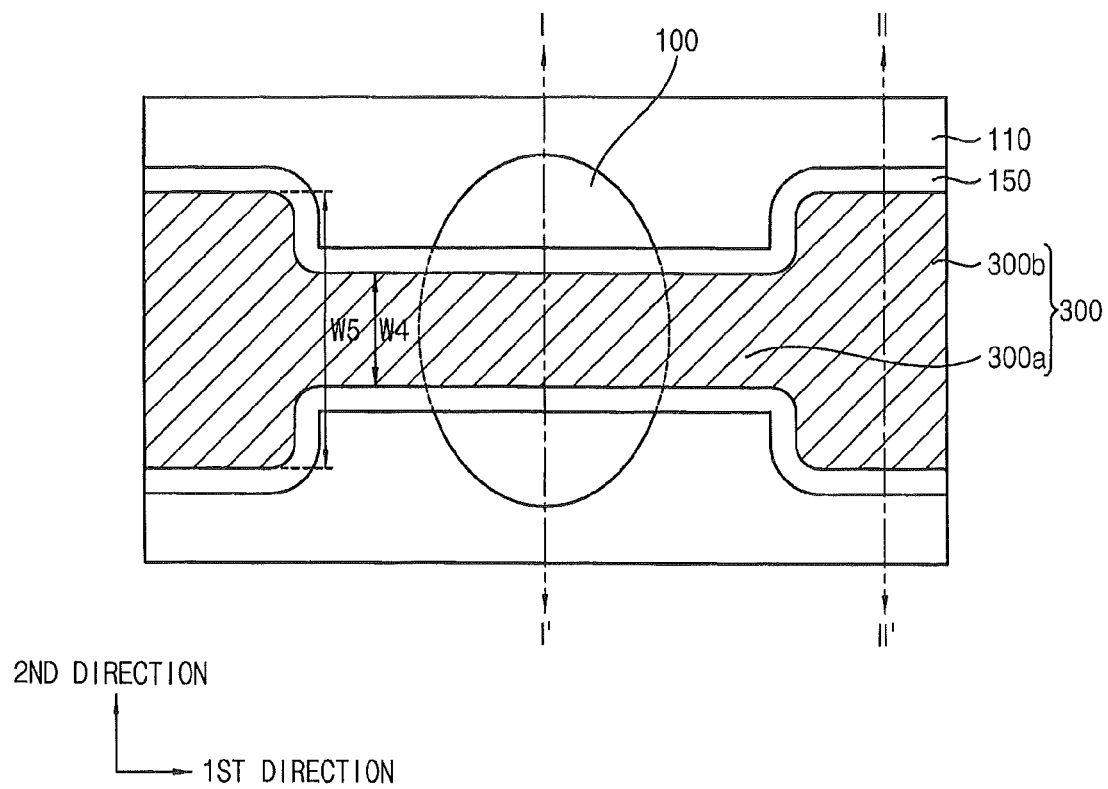
Figure 31A:
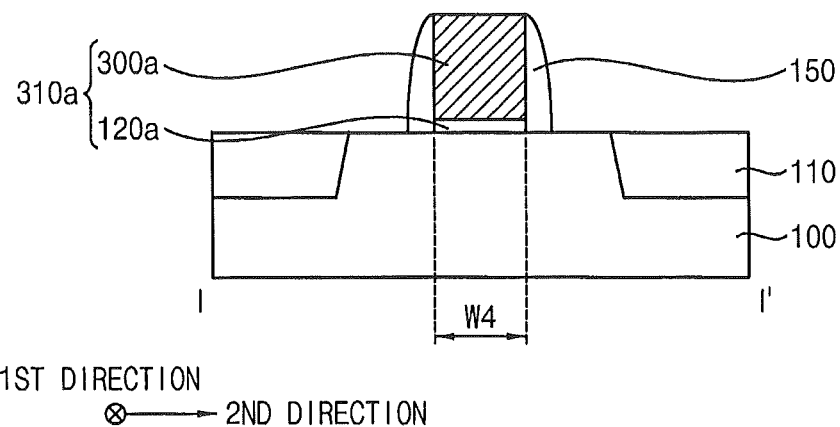
FIGS. 31A, 31B and 33A, 33B are corresponding cross-sectional views of FIGS. 30 and 32, respectively, according to example embodiments of present inventive concepts.
Figure 31B:
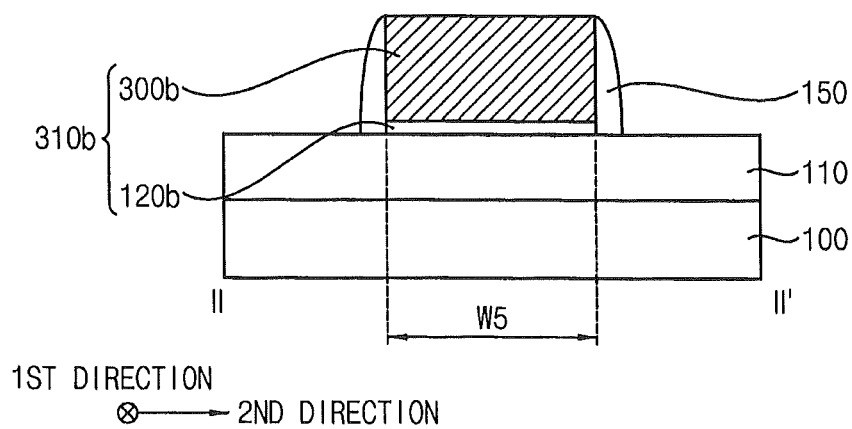
Figure 32:
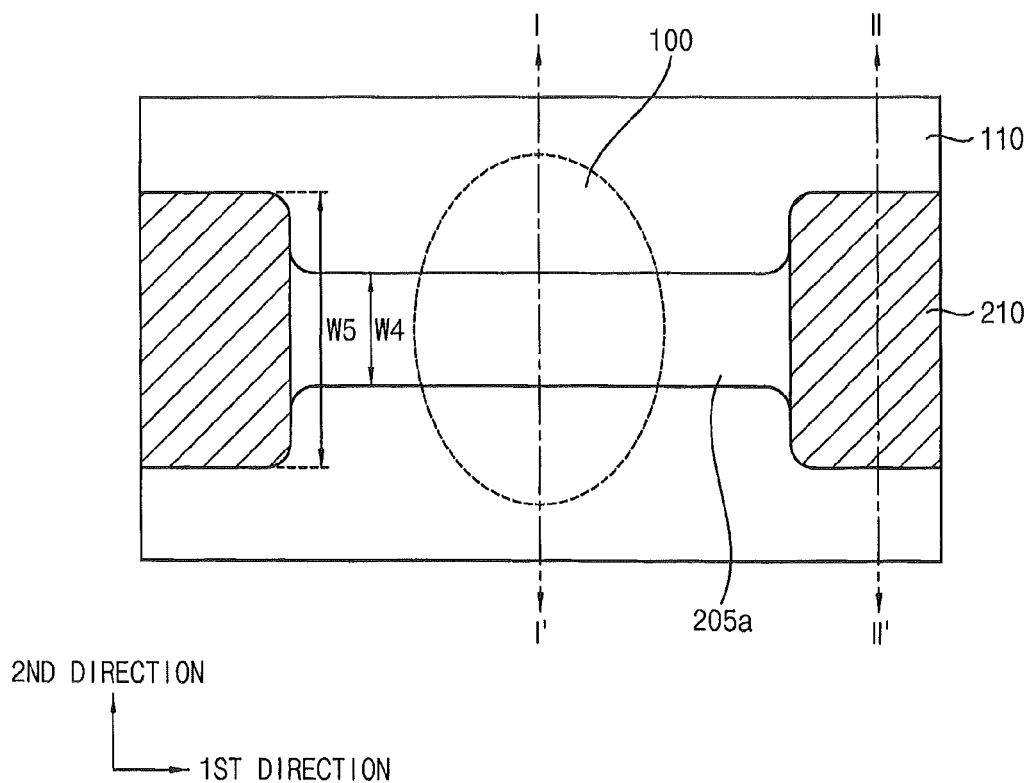
Figure 33A:
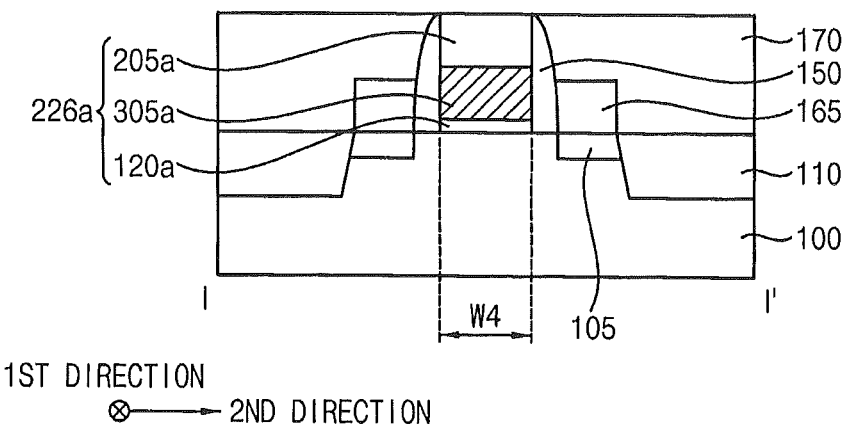
Figure 33B:
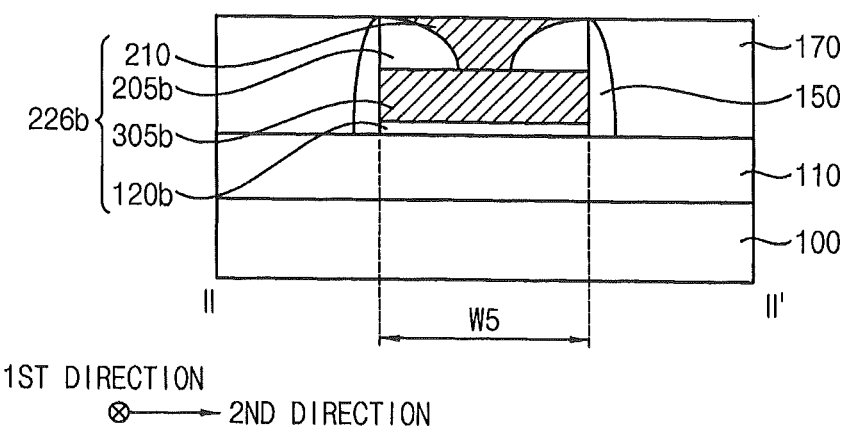

FIGS. 30 and 32 are plan views illustrating stages of a method of manufacturing a semiconductor device in accordance with example embodiments, and FIGS. 31A, 31B, 33A and 33B are cross-sectional views of the semiconductor device. Particularly, FIGS. 31A and 33A are corresponding cross-sectional views of the semiconductor device cut along a line I-I' of FIGS. 30 and 32, respectively, and FIGS. 31B and 33B are cross-sectional views of the semiconductor device cut along a line II-II' of FIGS. 30 and 32, respectively. This method may be used for forming the semiconductor device of FIGS. 28, 29A and 29B, however, may not be limited thereto. Additionally, this method may include processes substantially the same as or similar to those illustrated with reference to FIGS. 17 to 19 may be performed, and thus detailed descriptions thereon are omitted herein.

Referring to FIGS. 30, 31A and 31B, a process substantially the same as or similar to that illustrated with reference to FIG. 17 may be performed.

Thus, a first preliminary gate structure 310a including a first gate insulation layer pattern 120a and a first preliminary gate electrode 300a sequentially stacked on a substrate 100 and a portion of an isolation layer 110 may be formed, and a second preliminary gate structure 310b including a second gate insulation layer pattern 120b and a second preliminary gate electrode 300b sequentially stacked on a remaining portion of the isolation layer 110 may be formed. A fourth width W4 along the second direction of the first preliminary gate structure 310a may be smaller than a fifth width W5 along the second direction of the second preliminary gate structure 310b.

An outer spacer 150 may be formed on sidewalls of the first and second preliminary gate structures 310a and 310b.

Referring to FIGS. 32, 33A and 33B, processes substantially the same as or similar to those illustrated with reference to FIGS. 18 to 19 may be performed.

Thus, an impurity region 105 and an ESD layer 160 may be formed on the active region of the substrate 100 adjacent to the first preliminary gate structure 310a.

A first lower gate electrode 305a and an inner spacer layer 205a may be formed on the first gate insulation layer pattern 120a, and a second lower gate electrode 305b, an upper gate electrode 210 and an inner spacer 205b may be formed on the second gate insulation layer pattern 120b. The first gate insulation layer pattern 120a, the first lower gate electrode 305a and the inner spacer layer 205a sequentially stacked may form a first gate structure 226a, and the second gate insulation layer pattern 120b, the second lower gate electrode 305b, the upper gate electrode 210 and the inner spacer 205b may form a second gate structure 226b.

Referring to FIGS. 28, 29A and 29B, a process substantially the same as or similar to that illustrated with reference to FIG. 16 may be performed to manufacture the semiconductor device.

The above semiconductor device may be applied to various types of memory devices including gate structures. For example, the semiconductor device may be applied to gate structures in a memory cell region or a peripheral circuit region of volatile memory devices such as DRAM devices or SRAM devices, or non-volatile memory devices such as flash memory devices, PRAM devices, MRAM devices, RRAM devices, etc. Additionally, the semiconductor device may be applied to gate structures of logic devices such as central processing units (CPUs), main processing units (MPUs), or application processors (APs), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a gate insulation layer pattern on a substrate;
   a lower gate electrode on the gate insulation layer pattern;
   a high-k dielectric layer pattern on the gate insulation layer pattern, the high-k dielectric layer pattern surrounding a bottom and a sidewall of the lower gate electrode;
   an upper gate electrode on the lower gate electrode, the upper gate electrode having a width that gradually increases from a bottom portion toward a top portion thereof, the width of the bottom portion of the upper gate electrode being smaller than a width of a top surface of the lower gate electrode; and
   a spacer directly on a top surface of the high-k dielectric layer pattern, the spacer contacting a sidewall of the upper gate electrode.

2. The semiconductor device of claim 1,
   wherein the spacer comprises a first inner spacer,
   wherein the semiconductor device further comprises a second inner spacer on the gate insulation layer pattern, and
   wherein the second inner spacer is on an outer sidewall of the high-k dielectric layer pattern.

3. The semiconductor device of claim 1, wherein the width of the top portion of the upper gate electrode is substantially equally wide as a width of a bottom portion of the high-k dielectric layer pattern.

4. The semiconductor device of claim 1, wherein the width of the top surface of the lower gate electrode is substantially equally wide as the width of the top portion of the upper gate electrode.

5. The semiconductor device of claim 1, wherein the spacer includes a low-k dielectric material.

6. The semiconductor device of claim 1, further comprising:
    an outer spacer on a sidewall of the semiconductor device;
    a metal silicide pattern on the substrate adjacent the outer spacer; and
    a contact plug contacting the metal silicide pattern, the contact plug including a metal, a metal nitride, or a doped polysilicon.

7. The semiconductor device of claim 1, wherein the lower gate electrode is a single layer that is uniformly wide or substantially uniformly wide from a bottom surface of the lower gate electrode to the top surface of the lower gate electrode.

8. A semiconductor device, comprising:
    a gate insulation layer pattern on a substrate and an isolation layer, the substrate including an active region and a field region;
    a lower gate electrode on the gate insulation layer pattern, the lower gate electrode including:
        a first portion on at least the active region of the substrate; and
        a second portion on the field region of the substrate, the second portion being connected to the first portion and having a first width that is wider than a second width of the first portion;
    a high-k dielectric layer pattern on the gate insulation layer pattern, the high-k dielectric layer pattern surrounding a bottom and a sidewall of the lower gate electrode;
    a spacer layer covering a top surface of the first portion of the lower gate electrode;
    an upper gate electrode on the second portion of the lower gate electrode, the upper gate electrode having a width that gradually increases from a bottom portion toward a top portion thereof, and the width of the bottom portion of the upper gate electrode being narrower than a width of a top surface of the second portion of the lower gate electrode; and
    a spacer directly on a top surface of the high-k dielectric klyer pattern, the spacer contacting a sidewall of the upper gate electrode and the spacer layer.

9. The semiconductor device of claim 8, wherein the spacer includes a low-k dielectric material.

10. The semiconductor device of claim 8, further comprising:
    a metal silicide pattern on the substrate adjacent to the spacer; and
    a contact plug contacting the metal silicide pattern, the contact plug including a metal, a metal nitride, or doped polysilicon.

11. The semiconductor device of claim 8, further comprising:
    an insulating interlayer surrounding at least a portion of a side wall of the spacer.

12. The semiconductor device of claim 6, further comprising:
    an insulating interlayer surrounding at least a portion of a side wall of the outer spacer.

\* \* \* \* \*